United States Patent [19]
Choi et al.

[11] Patent Number: 5,625,590
[45] Date of Patent: Apr. 29, 1997

[54] NONVOLATILE SEMICONDUCTOR MEMORY

[75] Inventors: Beyng-Sun Choi; Young-Ho Lim, both of Suwon, Rep. of Korea

[73] Assignee: Samsung Electronics Co., Ltd., Suwon, Rep. of Korea

[21] Appl. No.: 574,970

[22] Filed: Dec. 19, 1995

[30] Foreign Application Priority Data

Dec. 19, 1994 [KR]  Rep. of Korea ............... 35016/1994

[51] Int. Cl.$^6$ ............................................. G11C 7/00
[52] U.S. Cl. ........................... 365/185.17; 365/185.11; 365/230.04; 365/189.05
[58] Field of Search ................... 365/185.17, 185.11, 365/185.13, 230.03, 230.04, 230.05, 189.05, 230.08

[56] References Cited

U.S. PATENT DOCUMENTS 4,825,098  4/1989  Aoyama .......................... 365/230.05
4,961,171  10/1990  Pinkham et al. ................. 365/230.05
5,416,742  5/1995  Takada ........................... 365/230.04

*Primary Examiner*—David C. Nelms
*Assistant Examiner*—Vu A. Le
*Attorney, Agent, or Firm*—Cushman Darby & Cushman, IP Group of Pillsbury Madison & Sutro LLP

[57] ABSTRACT

A nonvolatile semiconductor memory according to the present invention includes a plurality of floating gate type memory cells arranged in rows and columns, a plurality of word lines, each word line being connected to the memory cells arranged in a given one of the rows, and a plurality of bit lines arranged in parallel to one another. Each bit line is connected to the memory cells arranged in a given one of the columns and the bit lines are divided into first bit lines and second bit lines which are arranged to alternate with one another. A page buffer is also included which has a first page buffer portion connected to the first bit lines extending in a first column direction and a second page buffer portion connected to the second bit lines extending in a second column direction, the first column direction being opposite to the second column direction. This construction allows for high integration density and reduced data loading cycle time.

4 Claims, 16 Drawing Sheets

NONVOLATILE SEMICONDUCTOR MEMORY

BACKGROUND OF THE INVENTION

1. Field of the Invention

The present invention relates to semiconductor memories, and more particularly to high density nonvolatile semiconductor memories.

2. Description of the Related Art

Today's nonvolatile semiconductor memories require higher densities along with improvements in their performance and operation speed. A conventional nonvolatile semiconductor memory includes an array of memory cells each of which is comprised of a floating gate transistor having a floating gate, a control gate, a source and a drain. The memory cells are arranged in a matrix configuration of rows and columns. The control gates of the memory cells in a given row of memory cells are connected to the same one of a plurality of word lines. The drains of the memory cells in a given column of memory cells are connected to the same one of a plurality of bit lines. The memory cells, word lines and bit lines constitute a memory cell array. In order to improve an operation speed, data stored in the memory cells of a selected word line is simultaneously read out through the plurality of bit lines. Such a read operation is generally called a page read operation. The read-out data on the bit lines is temporarily stored in respective data latches generally called a page buffer. In a program operation, data input through data I/O pads or terminals is successively stored or loaded in the page buffer, and then the loaded data in the page buffer is thereafter programmed to the memory cells of a selected word line. Such a program operation is generally called a page program operation. These page read and page program operations are disclosed in the U.S. patent application Ser. No. 08/171,300, assigned to the present assignee. In order to perform the page read and page program operations, the data latches must be connected to respective bit lines. However, if the memory capacity of a nonvolatile semiconductor memory becomes higher without increasing the chip size or area, each of pitches or widths between adjacent bit lines should be reduced according to the increased memory capacity. Thus, there is a limitation in reducing the area occupied by the data latch connected to each bit line. Moreover, when employing a sense amplifier and data latch which are connected to each bit line in order to sense and store the data read out thereto, it is more difficult to reduce the pitch between all adjacent bit lines. Therefore, it is desirable to have a sophisticated layout that allows each of data latches and each of sense amplifiers to be placed between adjacent bit lines without increasing on-chip size or area.

Conventional nonvolatile semiconductor memories, such as electrically erasable and programmable read-only-memories (hereinafter referred to as an EEPROMs) with NAND structured cells, need large periods of time to sequentially store data from each data I/O terminal into corresponding data latches or to serially output data from data latches to a respective data I/O terminal. For example, a write cycle time, i.e. a time interval between the starts of successive data loading cycles from the data I/O terminals into the data latches, and a read cycle time, i.e. a time interval between the starts of successive read cycles from the data latches to the data I/O terminals, require about 80 nsec, respectively. Therefore, an EEPROM with high reliability and performance is needed which allows reduced data loading and read cycle times, using a reduced power supply voltage such as 3.3 volts.

SUMMARY OF THE INVENTION

It is therefore an object of the present invention to provide a nonvolatile semiconductor memory capable of being highly integrated without increasing chip size.

It is another object of the present invention to provide a nonvolatile semiconductor memory capable of programming data to and reading data from the memory cells of a selected word line at high speed.

It is still another object of the present invention to provide a nonvolatile semiconductor memory capable of promoting the convenience of users during program and read operations.

It is further still another object of the present invention to provide a nonvolatile semiconductor memory capable of sequentially reading data from and loading data into data latches in shorter cycle times per byte.

To achieve the above objects of the present invention, the nonvolatile semiconductor memory comprises a plurality of floating gate type memory cells arranged in rows and columns; a plurality of word lines, each word line being connected to the memory cells arranged in a given one of the rows; a plurality of bit lines arranged in parallel to one another, each bit line being connected to the memory cells arranged in a given one of the columns, said bit lines being divided into a first bit lines and a second bit lines which are arranged so as to alternate one another; and a page buffer circuit having a first page buffer connected to the first bit lines extending in a first column direction and a second page buffer connected to the second bit lines extending in a second column direction, the first column direction being opposite to the second column direction.

Since the generally parallel bit lines are alternately connected to the opposite first and second page buffers, the data latch and sensing circuit connected to each bit line ensure its sufficient occupation area, and thereby the very high integration of memory cells can be accomplished. In addition, since the common source lines, which are connected to the second ends of the respective NAND cell units of the memory cell array, are coupled in common to two or more on-chip common source line driving circuits, the source of the second selection transistor of each NAND cell unit may be connected to substantial ground during a read operation. Further, the alternate data reading operation from the first and second page buffers may allow the data read to be effected at high speed. Likewise, the alternate data loading operation to the first and second page buffers makes it possible to reduce the data loading cycle time.

Other embodiments of the present invention also exist. In one embodiment, the nonvolatile semiconductor memory comprises a plurality of NAND cell units arranged in rows and columns, each of the NAND cell units having a plurality of floating gate type memory cells connected in series; a plurality of word lines, each word line being connected to the memory cells arranged in a given one of the rows; a plurality of bit lines, each bit line being connected to one ends of the NAND cell units arranged in a given one of the columns; and a page buffer circuit having a first page buffer connected to the bit lines extending in a first column direction and a second page buffer connected to the bit lines extending in a second column direction, the bit lines each alternately extending to either one of the first and second column directions, the first column direction being opposite to the second column direction.

In another embodiment, the nonvolatile semiconductor memory according to the present invention comprises a plurality of floating gate type memory cells arranged in rows and columns; a plurality of word lines, each word line being connected to the memory cells arranged in a given one of the rows; a plurality of bit lines arranged in parallel to one another, each bit line being connected to the memory cells arranged in a given one of the columns, the bit lines being divided into a plurality of bit line groups each having a pair of adjacent bit lines; and a page buffer circuit having a first page buffer connected to first bit line groups extending in a first column direction and a second page buffer connected to second bit line groups extending in a second column direction, the bit line groups each alternately extending to either one of the first and second column directions, the first column direction being opposite to the second column direction.

The nonvolatile semiconductor memory according to the present invention also comprises a plurality of NAND cell units arranged in rows and columns on a semiconductor chip, each NAND cell unit having a plurality of floating gate type memory cells connected in series; a plurality of bit lines, each bit line being connected to one ends of the NAND cell units arranged in a given one of the columns; a plurality of common source lines, each common source line being connected to the other ends of the NAND cell units; and common source line driving circuits formed on at least two regions of the semiconductor chip, each common source line driving circuit being connected in common to the common source lines.

With respect to reading data stored at a plurality of memory cells connected to a selected word line of a plurality of word lines through a plurality of bit lines connected to the memory cells, the nonvolatile semiconductor memory according to the present invention comprises first and second page buffers respectively connected to a first group of a predetermined number of bit lines of the plurality of bit lines and a second group of the remaining bit lines, for storing read data on the first and second group bit lines; and a read circuit for alternately providing the read data stored at the first and second page buffers to data input/output terminals every cycle of a read enable signal.

With respect to the page programming, the nonvolatile semiconductor memory according to the present invention has a page buffer for storing data input through a plurality of data input/output terminals in response to a write enable signal, and a plurality of bit lines connected to the page buffer, for programming data stored in the page buffer to a plurality of memory cells connected to the bit lines and to a selected word line of a plurality of word lines. The page buffer has first and second page buffer portions respectively connected to a predetermined number of first group bit lines and remaining second group bit lines of the bit lines. A data loading circuit is also used for alternately latching the data input through the input/output terminals every cycle of the write enable signal and then alternately storing the data in the first and second page buffers every cycle of the write enable signal.

BRIEF DESCRIPTION OF THE DRAWINGS

These and other objects, features and advantages of the present invention are better understood by reading the following detailed description of the invention, taken in conjunction with the accompanying drawings, wherein.

DETAILED DESCRIPTION OF THE PREFERRED EMBODIMENT

A detailed description of the preferred embodiments of the present invention will be made in conjunction with the accompanying drawings. It should be noted that the same parts or elements of the drawings represent the same number or symbol wherever possible.

In the following description, numerous specific details, such as memory cells, the number of NAND cells, bit lines, the value of voltages, circuit elements and parts and so on, are set forth in order to provide a through understanding of the present invention. It will be obvious to those skilled in the art that the present invention may be practiced without implementing these specific details.

The term "memory cell" as used in this specification refers to a floating gate MOS FET having a source, a drain, a floating gate and a control gate. The term "program" as used herein refers to a permanent write of data to one or more selected memory cell.

In the following description, character "k" is used to represent components associated with a k+1th data I/O pad or terminal. A power supply voltage of 3.3 volts is used, but it should be noted that the present invention is not limited to this voltage value.

An EEPROM of the present invention is manufactured by utilizing a CMOS manufacturing technologies, and employs depletion mode N-channel MOS transistors (hereinafter referred to as D type transistors) each having a threshold voltage of about −1.8 volts, enhancement mode N-channel MOS transistors (hereinafter referred to as N-channel transistors) each having a threshold voltage of about 0.7 volts, and P-channel MOS transistors (hereinafter referred to as P-channel transistors) each having a threshold voltage of about −0.9 volts.

Description will be made with reference to a 4M×8-bit EEPROM of NAND cell-type. However, it should be noted that the present invention is not limited to this NAND cell-type EEPROM.

Figure 1:
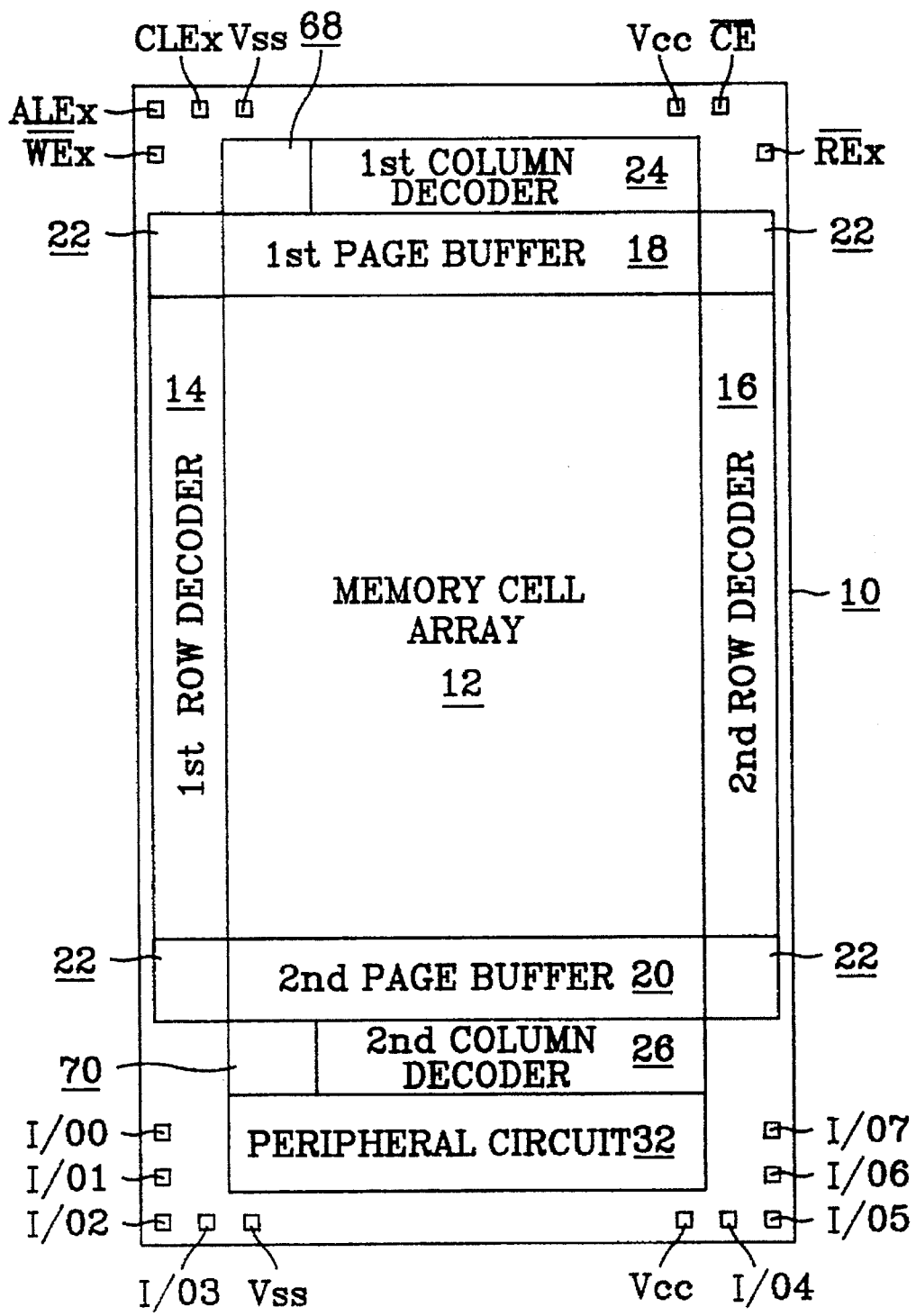
FIG. 1 is a plan view showing a chip layout construction according to a preferred embodiment of the present invention.

FIG. 1 is a chip layout configuration diagram of the EEPROM according to a preferred embodiment of the present invention, and is an enlarged diagram for purposes of illustration.

Referring to FIG. 1, a memory cell array 12 is disposed in the central surface portion of a rectangular shaped semiconductor chip 10. On the left and right sides of the array 12 are respectively arranged first and second row decoders 14 and 16. First and second page buffers 18 and 20 are respectively disposed on the upper and lower sides of the array 12, and four common source line driving circuits 22 are respectively arranged outside four corners of the array 12. On the upper side of the first page buffer 18 are disposed a first column decoder 24 and first column address counter 68 which are arranged adjacent side by side in the horizontal direction. On the lower side of the second page buffer 20 are arranged a second column decoder 26 and second column address counter 70 which are disposed adjacent side by side in the horizontal direction. On the lower side of the second column decoder 26 and second column address counter 70 are disposed a peripheral circuit 32, such as clock generator, various buffers, control circuit, data input/output switch circuit and so on. In the vicinity of four corners of the chip 10 are arranged data I/O pads I/O0 to I/O7, power supply pads Vcc, ground pads Vss, a write enable signal supply pad $\overline{WE}x$, an address latch enable signal supply pad ALEx, a chip enable signal supply pad $\overline{CE}$, a command latch enable signal supply pad CLEx and a read enable supply pad $\overline{RE}x$.

The memory cell array 12 has 32-Megabit memory cells arranged in a matrix form of 4,096 rows and 8,192 columns. The control gates of the memory cells in each of the rows are connected to a given one of 4,096 word lines, and the drains of the memory cells in each of the columns are connected to a given one of 8,192 bit lines.

Figure 2:
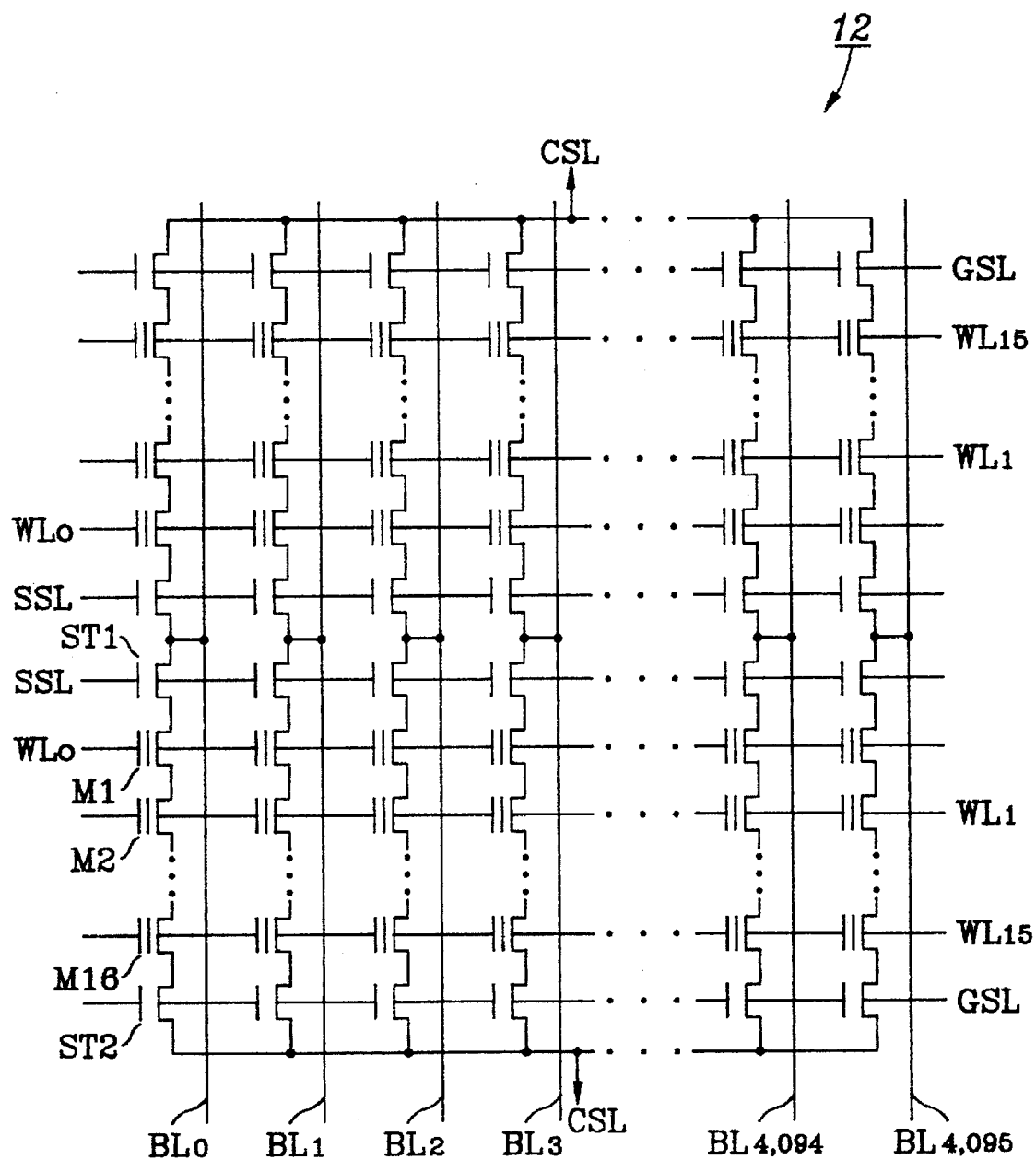
FIG. 2 is an equivalent circuit diagram showing a portion of the memory cell array of FIG. 1.

FIG. 2 is an equivalent circuit diagram showing a portion of the memory cell array 12 only two blocks of which are shown for the convenience of illustration. Each of NAND cell units includes 16 memory cells M1 to M16 the channels of which are connected in series between the source of a first selection transistor ST1 and the drain of a second selection transistor ST2. The drain of the first selection transistor ST1 of each NAND cell unit is connected to a corresponding bit line conductor, which is formed of a refractory metal silicide material or a refractory metal through an ohmic contact. The source of the second selection transistor ST2 of each NAND cell unit is connected to a common source line CSL of metal or silicide material. The common source lines are insulated from the bit lines and word lines, and are connected to the common source line driving circuits 22 at four corners as shown in FIG. 1. Therefore, since each common source line is coupled with any one of the common source line driving circuits, it has an advantage of driving the source of the second selection transistor ST2 of each NAND cell unit to a generally ground potential during a read operation. Each row block is composed of NAND cell units in a given one row. In each row block, the control gates of the first selection transistors ST1, the control gates of the memory cells M1 to M16 and the control gates of the second selection transistors ST2 are respectively connected to a first selection line SSL, word lines $WL_0$ to $WL_{15}$ and a second selection line GSL, each of which is manufactured of a refractory metal silicide material. The first selection line SSL in the memory cell array 12 is connected to the first row decoder 14 of FIG. 1 and the second selection line GSL to the second row decoder 16 of FIG. 1. The odd word lines $WL_0$, $WL_2$, . . . $WL_{14}$ and the even word lines $WL_1$, $WL_3$, . . . $WL_{15}$ in each row block are respectively connected to the first and second row decoders 14 and 16. Therefore, since the word lines $WL_0$ to $WL_{15}$ are alternately connected to the first and second row decoders 14 and 16, the first and second row decoders for driving the respective word lines can be manufactured with sufficient on-chip area. The construction and plan layout of the NAND cell units in the memory cell array is disclosed in the U.S. patent application Ser. No. 08/171,300 which is expressly incorporated herein by reference.

Figure 3A:
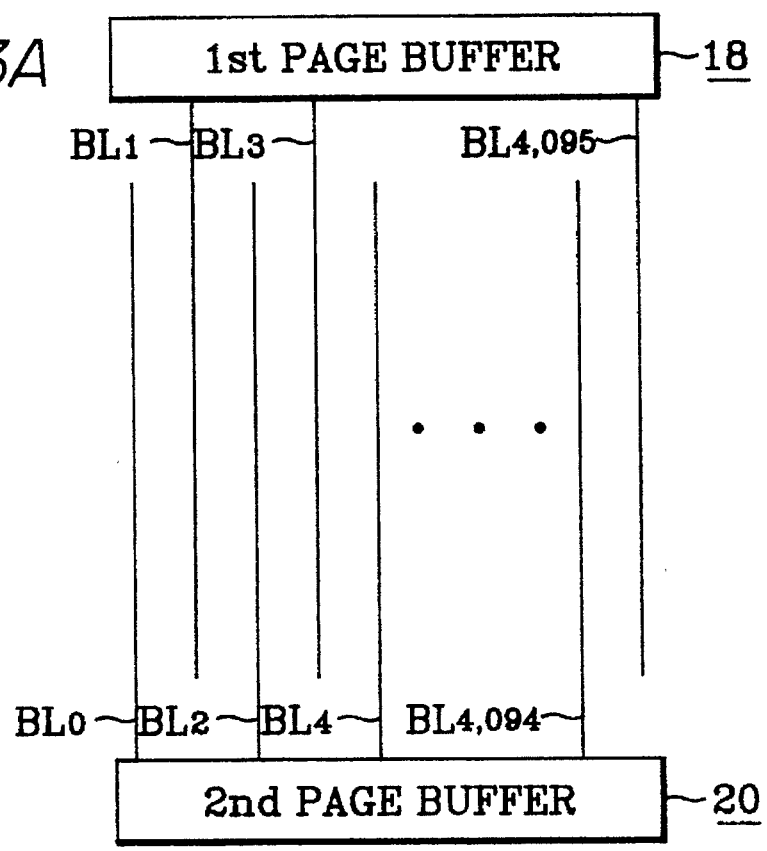
FIGS. 3A and 3B are respectively diagrams showing connection relationships between bit lines and page buffers according to the first and second preferred embodiments of the present invention.
Figure 3B:
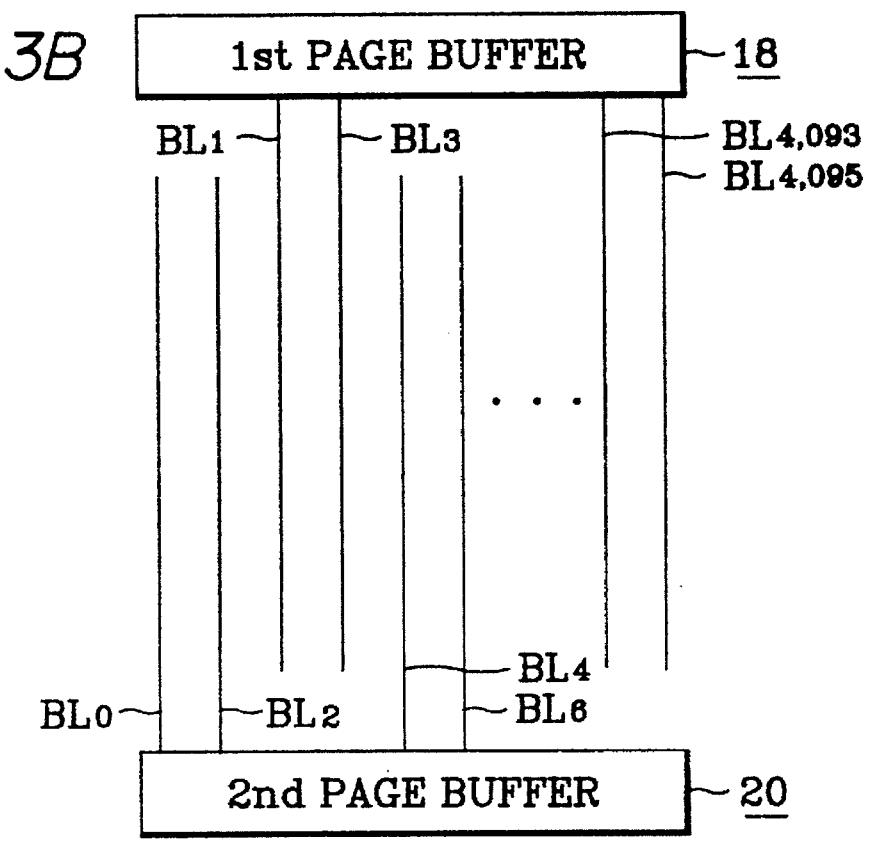

FIGS. 3A and 3B are diagrams showing the connection relationships between the bit lines and the page buffers.

Referring to FIG. 3A, bit lines $BL_0$ to $BL_{4,095}$ are alternately connected to the first and second page buffers 18 and 20. The first and second page buffers 18 and 20 are disposed so as to face each other with respect to generally parallel bit lines $BL_0$ to $BL_{4,095}$. Therefore, since even bit lines $BL_1$, $BL_3$, . . . , $BL_{4,095}$ constituting a first bit line group alternate with odd bit lines $BL_0$, $BL_2$, . . . , $BL_{4,094}$ constituting a second bit line group, each pitch between adjacent bit lines of each of the first and second page buffers 18 and 19 increases to be twice as wide as that of the prior art, thereby allowing a data latch connected with each of the bit lines to be disposed in an acceptable limited area.

FIG. 3B is a diagram showing the connection relationship between bit lines and page buffers according to another preferred embodiment of the present invention. Referring to FIG. 3B, adjacent bit line pairs $BL_0$, $BL_2$; $BL_1$, $BL_3$; $BL_4$, $BL_6$; . . . ; $BL_{4,093}$, $BL_{4,095}$ are alternately connected to second and first page buffers 20 and 18. Since the bit line pairs connected to one page buffer alternate with the other bit line pairs connected to the other page buffer, data latches in each of the first and second page buffers may be arranged with enough area between the bit line pairs.

The bit lines $BL_0$ to $BL_{4,095}$ parallel in the column direction may be arranged at regular intervals in the row direction to make coupling capacitors therebetween equal one another. To provide in equal the coupling capacitance of each of the outermost bit lines $BL_0$ and $BL_{4,095}$, dummy bit lines may be disposed outside the bit lines $BL_0$ and $BL_{4,095}$ at the same intervals or pitches as those between adjacent bit lines $BL_0$ to $BL_{4,095}$.

The first and second page buffers 18 and 20 are respectively connected to the first and second column decoders 24 and 26. The first and second page buffers 18 and 20 serve to temporarily store data from corresponding bit lines during a read operation and to provide stored data onto corresponding bit lines during a program operation. The first and second decoders 24 and 26 are respectively connected with the first and second page buffers 18 and 20, and serve to decode column address signals such that the first and second page buffers 18 and 20 receive or output alternately one byte of data.

Figure 4:
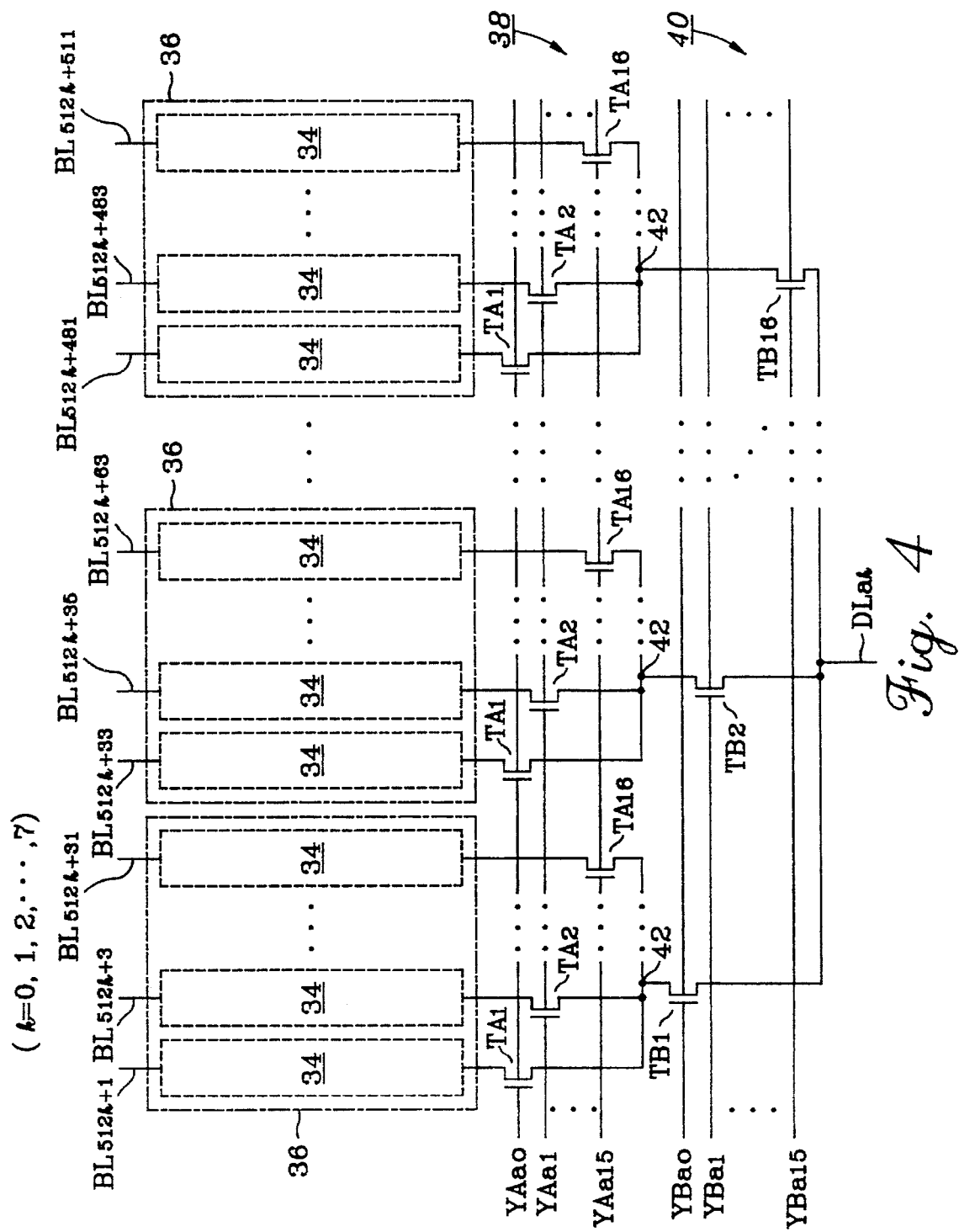
FIG. 4 is a schematic circuit diagram showing a page buffer and column decoder related to a first data line DLak.

FIG. 4 is a schematic circuit diagram representing a portion of the first page buffer and first column decoder associated with k+1th first data line DLak, wherein k=0, 1, 2, ..., 7. In the drawing, data latch and sensing circuits 34 constitute the first page buffer 18. The first page buffer 18 is composed of 2,048 data latch and sensing circuits 34 first ends of which are respectively connected to bit lines $BL_{512k+1}$, $BL_{512k+3}$, $BL_{512k+5}$, ..., $BL_{512k+511}$. 2,048 data latch and sensing circuits 34 are divided into 8 groups, and 256 data latch and sensing circuits 34 in each group are associated with a given one of 8 first data lines DLak which constitute a first data bus. 256 data latch and sensing circuits 34 associated with each data line DLak are divided into 16 subgroup circuits 36. The other ends of 16 data latch and sensing circuits 34 of each subgroup circuit 36 are respectively connected to the drains of the first selection transistors TA1 to TA16 constituting a first selection circuit 38, and one of the first selection transistors TA1 to TA16 therein is turned on in response to first column decoding signals $YA_{a0}$ to $YA_{a15}$. The sources of the first selection transistors TA1 to TA16 associated with each subgroup circuit 36 are connected to respective common nodes 42. The 16 common nodes 42 associated with the first data line DLak are respectively connected to the drains of second selection transistors TB1 to TB16 constituting a second selection circuit 40, and the sources thereof are connected in common to the first data line DLak. The control gates of second selection transistors TB1 to TB16 are respectively connected to second column decoding signals $YB_{a0}$ to $YB_{a15}$, and one of the second selection transistors TB1 to TB16 is turned on in response to the first column decoding signals $YB_{a0}$ to $YB_{a15}$.

The second page buffer 20 and second column decoder 26 are comprised of data latch and sensing circuits 34 and first and second selection circuits 38 and 40 in a similar manner as above mentioned first page buffer 18 and first column decoder 24. The second page buffer 20 has the same construction as the first page buffer 18 except that first ends of 2,048 data latch and sensing circuits 34 are respectively connected to the bit lines $BL_{512k}$, $BL_{512k+2}$, $BL_{512k+4}$, ..., $BL_{512k+510}$. The first column decoder 24 has the same construction as the second column decoder 26 except that the control gates of the first and second selection transistors are respectively connected to the second column decoding signals $YA_{b0}$ to $YA_{b15}$ and $YB_{b0}$ to $YB_{b15}$. As will be described hereinbelow, 8 second data lines DLbk from the second column decoder 26 constitute a second data bus 76.

Figure 5:
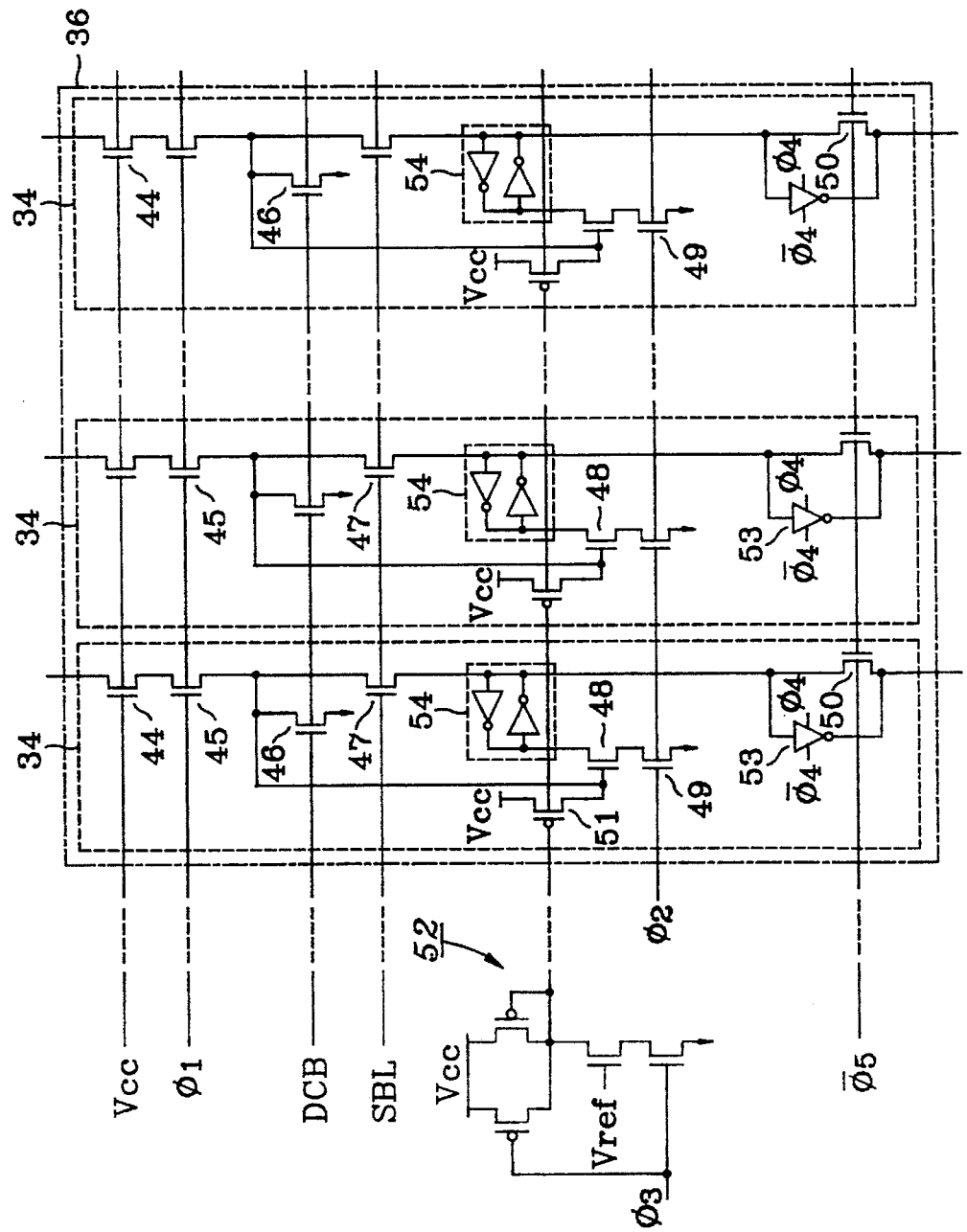
FIG. 5 is a schematic circuit diagram showing a part of first and second page buffers.

FIG. 5 is a schematic circuit diagram showing a part of the first and second page buffers. For the convenience of illustration, only one of 128 subgroup circuits of each page buffer is illustrated. In the figure, the subgroup circuit 36 is composed of 16 data latch and sensing circuits 34 each of which comprises N type transistors 44 to 50, a P type transistor 51, a data latch 54 and a tri-state inverter 53. A reference circuit 52 is provided on the outside of each page buffer. A circuit portion composed of the reference circuit 52 and the P type transistor 51 of each data latch and sensing circuit 34 constitute a current mirror type data sensing circuit. In each of data latch and sensing circuits 34, the drain of N type transistor 44 and the source of N type transistor 50 are respectively connected to a corresponding bit line and a corresponding first selection circuit. The N type transistors 50 are turned on in response to a control signal $\phi_5$ during a program operation, and the tri-state inverters 53 are enabled by the control signal $\phi_4$ and its inverted signal $\overline{\phi_4}$ upon completion of a data sensing and latching operation of data latch and sensing circuits 34 during the read operation. The operation of the subgroup circuit 36 and reference circuit 52 is discussed in detail in the U.S. patent application Ser. No. 08/171,300.

Figure 6:
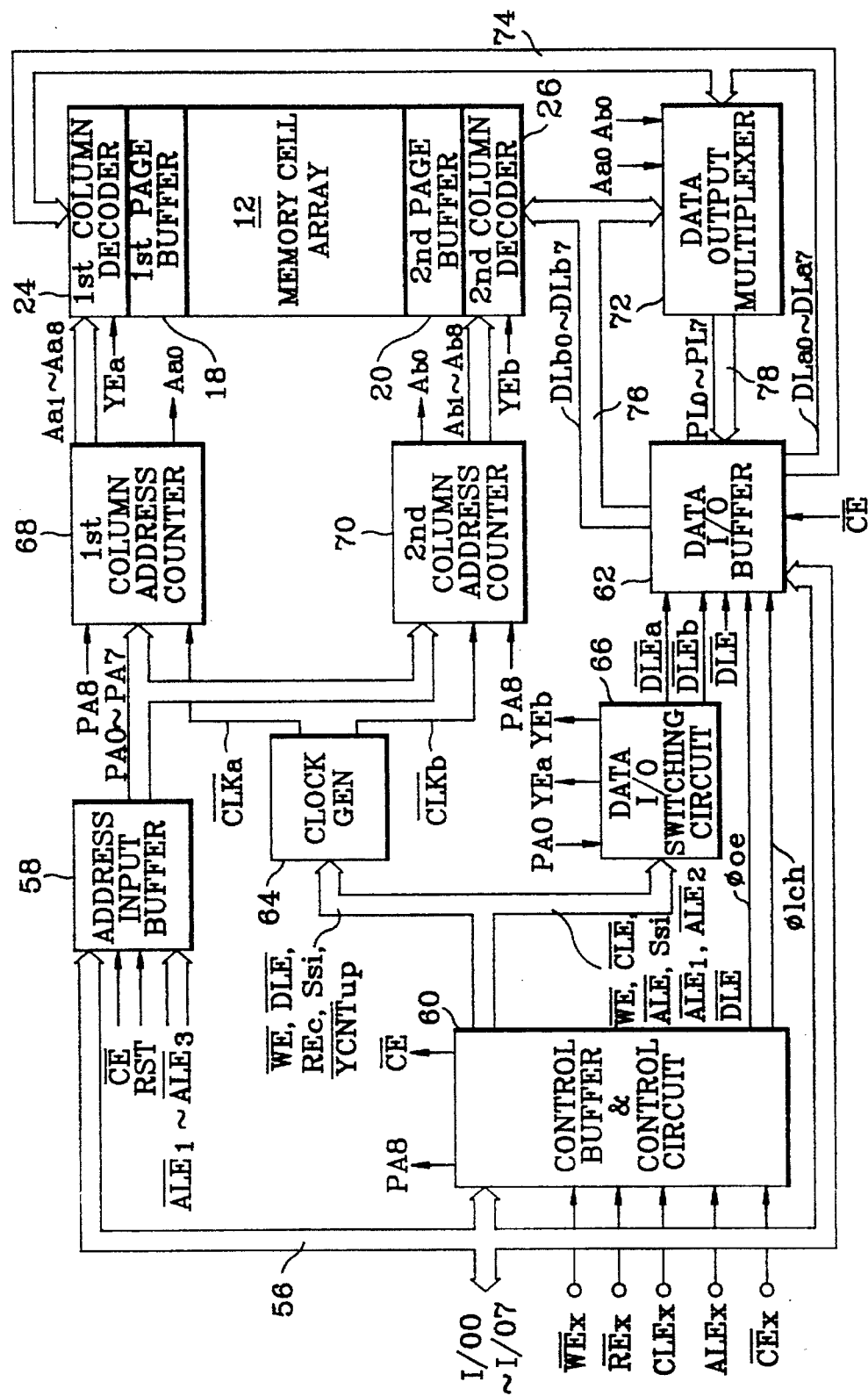
FIG. 6 is a circuit block diagram for performing read and program operations according to a preferred embodiment of the present invention.

FIG. 6 is a circuit block diagram showing various circuits for performing reading and programming operations according to a preferred embodiment of the present invention. An I/O bus 56 connected with data I/O pads I/O0 to I/O7 is connected to an address input buffer 58, a data I/O buffer 62 and a control buffer and control circuit 60. The control buffer and control circuit 60 has a control buffer composed of buffers for receiving to convert external control signals, such as an external write enable signal $\overline{WEx}$, external read enable signal $\overline{REx}$, external command latch enable signal CLEx, external address latch enable signal ALEx and external chip enable signal $\overline{CEx}$, into internal control signals of CMOS level such as a write enable signal $\overline{WE}$, read enable signal REc, command latch enable signal $\overline{CLE}$, address latch enable signal $\overline{ALE}$ and chip enable signal $\overline{CE}$, and command latches for storing command signals input through the data I/O pads I/O0 to I/O7. In addition, the control buffer and control circuit 60 has a control circuit for generating various control signals, such as first to third address latch enable signals $\overline{ALE_1}$ t $\overline{ALE_3}$, data loading command flag signal Ssi, data loading enable signal $\overline{DLE}$, address count-up signal $\overline{YCNTup}$, address signal PA8 and read and program control signals, with the combination of the internal control signals and each of commands, such as read, program and erase commands and so on, from the buffers. The circuit for generating the first to third address latch enable signals $\overline{ALE_1}$ to $\overline{ALE_3}$ is disclosed in Korean patent application No. 94-25243, which is expressly incorporated by reference into this application.

Figure 7:
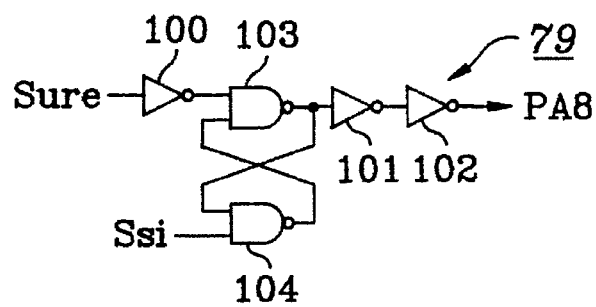
FIG. 7 is a schematic circuit diagram showing an address signal generator used in a control buffer and control circuit of FIG. 6.

Further, the control buffer and control circuit 60 includes an address signal generator 79 as illustrated in FIG. 7. The address signal generator 79 serves to generate a most significant column address signal PA8 in response to a start column designation command flag Sure. Since the column address signal PA8 is the most significant bit of the column address signals PA0 to PA8 capable of designating 512 byte of bit lines, the column address signal PA8 of a logic "low" level may designate first half of the memory array, i.e. 256 byte bit lines $BL_0$ to $BL_{2,047}$ corresponding to the first half, while the column address signal PA8 of a logic "high" level may designate the remaining, second half thereof, i.e. 256 byte bit lines $BL_{2,048}$ to $BL_{4,095}$ corresponding to the second half. The address signal generator 79 is a flip-flop circuit composed of inverters 100 to 102 and NAND gates 103 and 104.

Figure 8A:
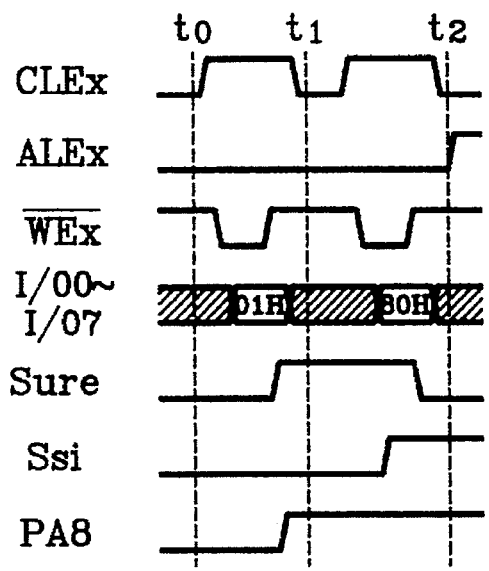
FIGS. 8A to 8B are timing charts showing timing relations between command inputs for performing a program operation and the signals shown in FIG. 6.
Figure 8B:
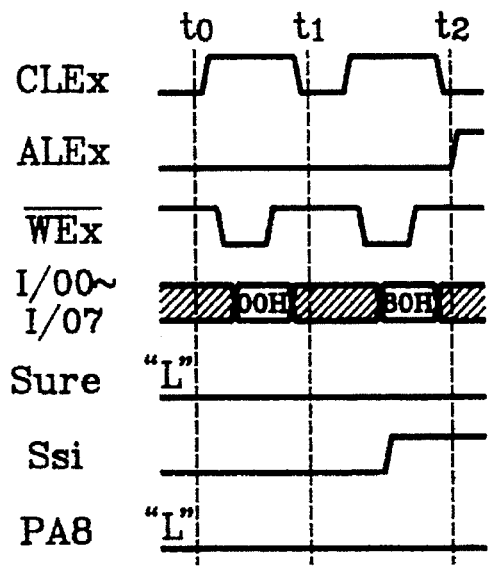
Figure 8C:
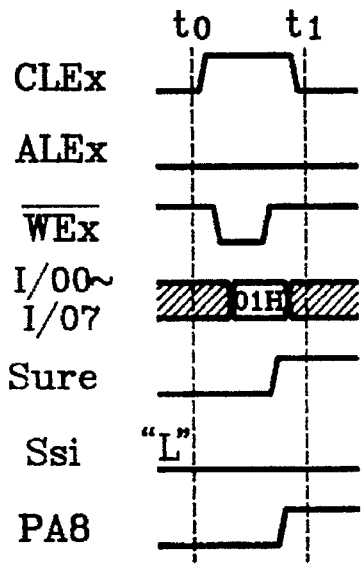
FIGS. 8C to 8D are timing charts showing timing relations between command inputs for performing a read operation and the signals shown in FIG. 6.
Figure 8D:
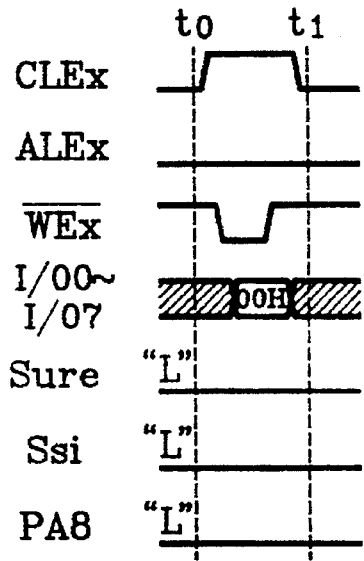

FIGS. 8A and 8B are timing charts showing timing relations between commands for performing a program operation and various signals as shown in FIG. 6, and FIGS. 8C and 8D are timing charts showing timing relations between commands for performing a read operation and various signals as shown in FIG. 6. As shown in FIGS. 8A and 8B, when the external command latch enable signal CLEx and external address latch enable signal ALEx are respectively at logic "high" and "low" levels between time $t_0$ and $t_1$, the column address signal PA8 is set to logic "high"

or "low" level by inputting a start bit line command 01H (hexa code) or 00H through the data I/O pads I/O0 to I/O7 with the toggling of the external write enable signal $\overline{WEx}$ to logic "low" level. Thereafter, the program start memory area and program operation are set by inputting a program command, i.e. 80H, through the data I/O pads I/O0 to I/O7 between time $t_1$ and $t_2$. As shown in FIG. 8A, if the command 01H is input to designate the second half of bit lines, the start column designation command flag Sure goes from a logic "low" level to logic "high" level. Then, the column address signal PA8 goes to a logic "high" level. Thereafter, if the command 80H is input to start programming, the data loading command flag Ssi goes from a logic "low" level to logic "high" level. Therefore, the column address signal PA8 is held at the logic "high" level even though the start column designation command flag Sure goes to a logic "low" level after the second toggling of $\overline{WEx}$. As shown in FIG. 8B, if the command 00H is input to designate the first half of the bit lines, the start column designation command flag Sure is held at a logic "low" level, and with the data loading command flag Ssi of logic "low" level, the column address signal PA8 stays at a logic "low" level.

As shown in FIGS. 8C and 8D, timing relations between commands for performing a read operation and the column address signal PA8 is the same as those of FIGS. 8A and 8B.

Figure 9:
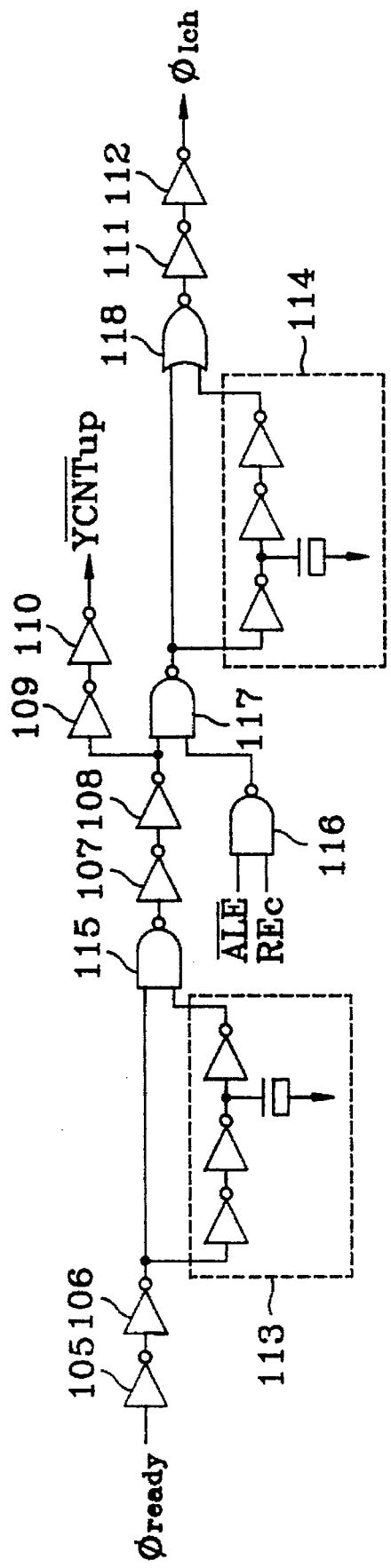
FIG. 9 is a schematic circuit diagram showing a control circuit for generating column address count-up signal and data output latch signal which are used in the control buffer and control circuit of FIG. 6.

FIG. 9 shows a control circuit of the control buffer and control circuit 60 of FIG. 6, for generating a column address count-up signal $\overline{YCNT}_{up}$ and a data output latch signal $\phi_{1ch}$ during a data read operation. The control circuit comprises inverters 105 to 112, delay circuits 113 and 114, NAND gates 115 to 117 and a NOR gate 118. A control signal $\phi_{ready}$ keeps a logic "high" level for about 400 nsec after completion of data sensing operation during read operation. In response to the control signal $\phi_{ready}$ which goes to the logic "high" level, the control circuit generates the column address count up signal $\overline{YCNT}_{up}$ which goes to a logic "low" level for about 50 nsec through the delay circuit 113. If the column address count up signal $\overline{YCNT}_{up}$ goes from the logic "low" level to a logic "high" level, the data output latch signal $\phi_{1ch}$ goes to a logic "high" level for about 40 nsec through the delay circuit 114 since the read enable signal REc is at a logic "low" level. Thereafter, with toggles of the read enable signal REc, the data output latch signal $\phi_{1ch}$ becomes a pulse train which synchronizes with "low" levels of the signal REc.

Returning to FIG. 6, the address input buffer 58 serves to latch to the external address signals from the data I/O terminals I/O0 to I/O7 into CMOS level signals in response to the first to third address latch enable signals $\overline{ALE}_1$ to $\overline{ALE}_3$. The data I/O buffer 62 comprises a data input buffer which serves to latch to convert the external data from the data I/O terminals I/O0 to I/O7 into CMOS level data and then provide the latched data to the first and second data buses 74 and 76 in response to the first and second data latch enable signals $\overline{DLEa}$ and $\overline{DLEb}$, and a data output buffer which functions to latch the output data on the third data bus 78 in response to the data output latch signal $\phi_{1ch}$ and then to provide the latched data onto the data I/O terminals I/O0 to I/O7 in synchronization with the data output enable signal $\phi_{oe}$.

Figure 10:
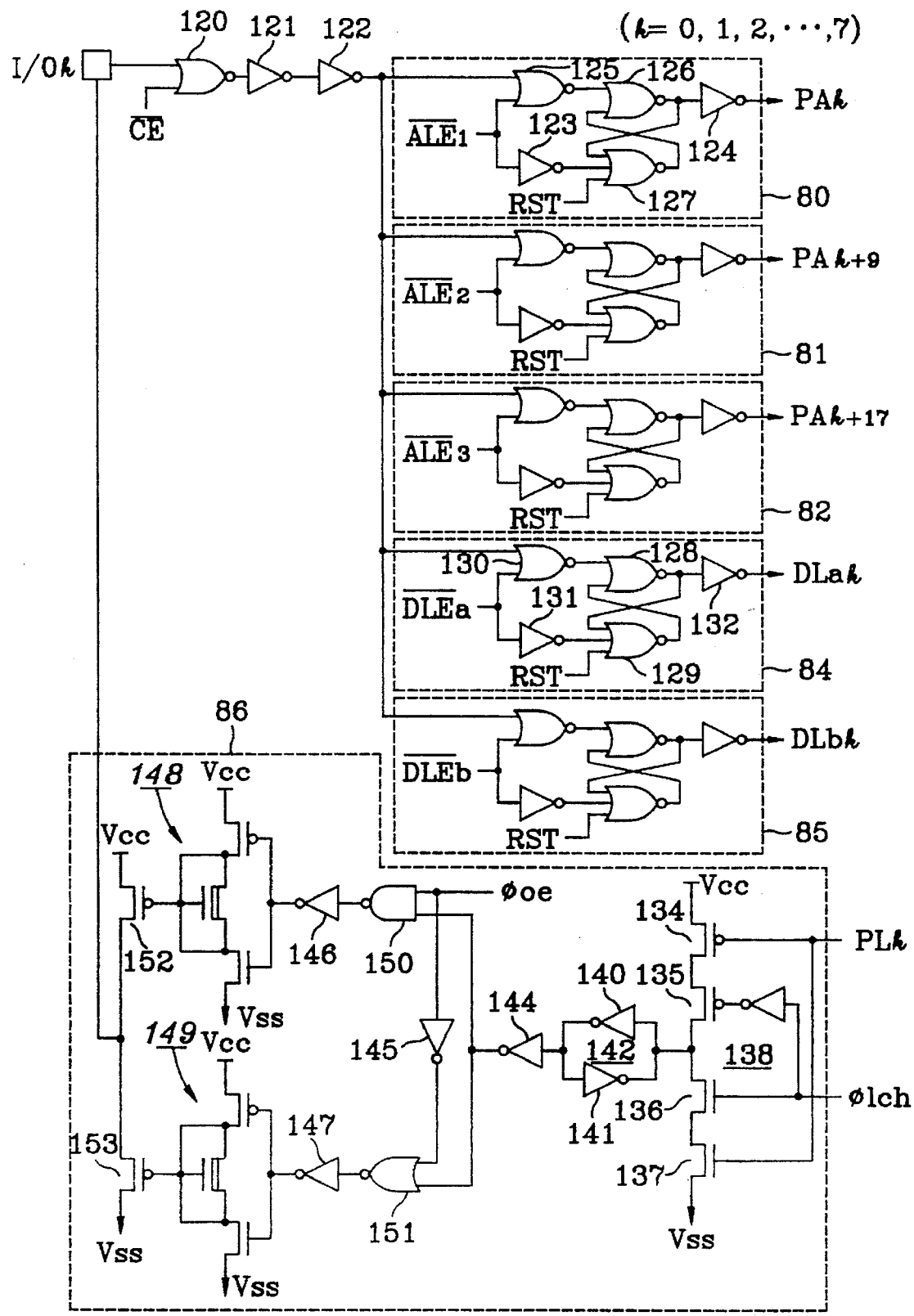
FIG. 10 is a schematic circuit diagram showing an address input buffer and data I/O buffer related to one I/O pad.

FIG. 10 is a schematic circuit diagram showing the address input buffer and data I/O buffer. For the convenience of illustration, the address input buffer and data I/O buffer connected to one of 8 data I/O terminals is illustrated. In the figure, the address input buffer comprises a NOR gate 120, inverters 121 and 122, and first to third address latches 80 to 82. Each of the first to third address latches 80 to 82 is composed of NOR gates 125 to 127 and inverters 123 and 124. When the chip enable signal $\overline{CE}$ is at a logic "low" level, the NOR gate 120 functions to convert an external address signal or external data from the data I/O terminal I/Ok into an internal CMOS address signal or data. The first to third address latches 80 to 82 function to latch the address signals from the data I/O terminal I/Ok to flip-flops composed of the NOR gates 126 and 127 in response to the first to third address latch enable signals $\overline{ALE}_1$ to $\overline{ALE}_3$. A power-on reset signal RST is a short pulse signal of logic "high" level from a typical power-on reset circuit (not shown) when the power supply voltage does not reach a predetermined voltage level upon power-on, and thereby the first to third address latches 80 to 82 are initialized to the logic "low" level.

The data input buffer comprises a NOR gate 120, inverters 121 and 122 and first and second data input latches 84 and 85. Each of the first and second data input latches 84 and 85 is composed of NOR gates 128 to 130 and inverters 131 and 132. Each of the first and second data input latches 84 and 85 function to store the input data through the data I/O terminal I/Ok into a flip-flop composed of the NOR gates 128 and 129, in response to a corresponding one of the first and second data latch enable signals $\overline{DLEa}$ and $\overline{DLEb}$. The power-on reset signal RST initializes both the first and second data input latches 84 and 85 to the logic "low" levels upon power-on as discussed above.

The data output buffers are respectively connected between data lines PL0 to PL7, which constitute a third data bus, and corresponding data I/O terminals I/O0 to I/O7. As shown in FIG. 10, the data output buffer 86 connected between the data line PLk and data I/O terminal I/Ok comprises a tri-state inverter 138 composed of P type transistors 134 and 135 and N type transistors 136 and 137, a data output latch 142 composed of inverters 140 and 141, inverters 144 to 149, a NAND gate 150, a NOR gate 151, and P type driving transistors 152 and 153. The tri-state inverter 138 serves to provide read data on the data line PLk to the data output latch 142 each time the data output enable signal $\phi_{1ch}$ goes to logic "high" level. The NAND gate 150 and NOR gate 151 provide the read data stored in the data output latch 142 onto the data I/O terminal I/Ok through driving transistors 152 and 153 in response to the data output enable signal $\phi_{oe}$.

Returning again to FIG. 6, the data I/O switching circuit 66 serves to generate first and second data latch enable signals $\overline{DLEa}$ and $\overline{DLEb}$ for controlling the data input latches 84 and 85 and first and second column decoder enable signals YEa and YEb for enabling the first and second column decoders 24 and 26, in response to control signals, such as write enable signal $\overline{WE}$, the command latch enable signal $\overline{CLE}$, address latch enable signal $\overline{ALE}$, data loading command flag Ssi, first and second address latch enable signals $\overline{ALE}_1$ and $\overline{ALE}_2$, and data loading enable signal DLE which are output from the control buffer and control circuit 60, and the least significant address signal PA0 from the address input buffer 58. A schematic circuit diagram showing the data I/O switching circuit 66 is illustrated in FIG. 11.

Figure 11:
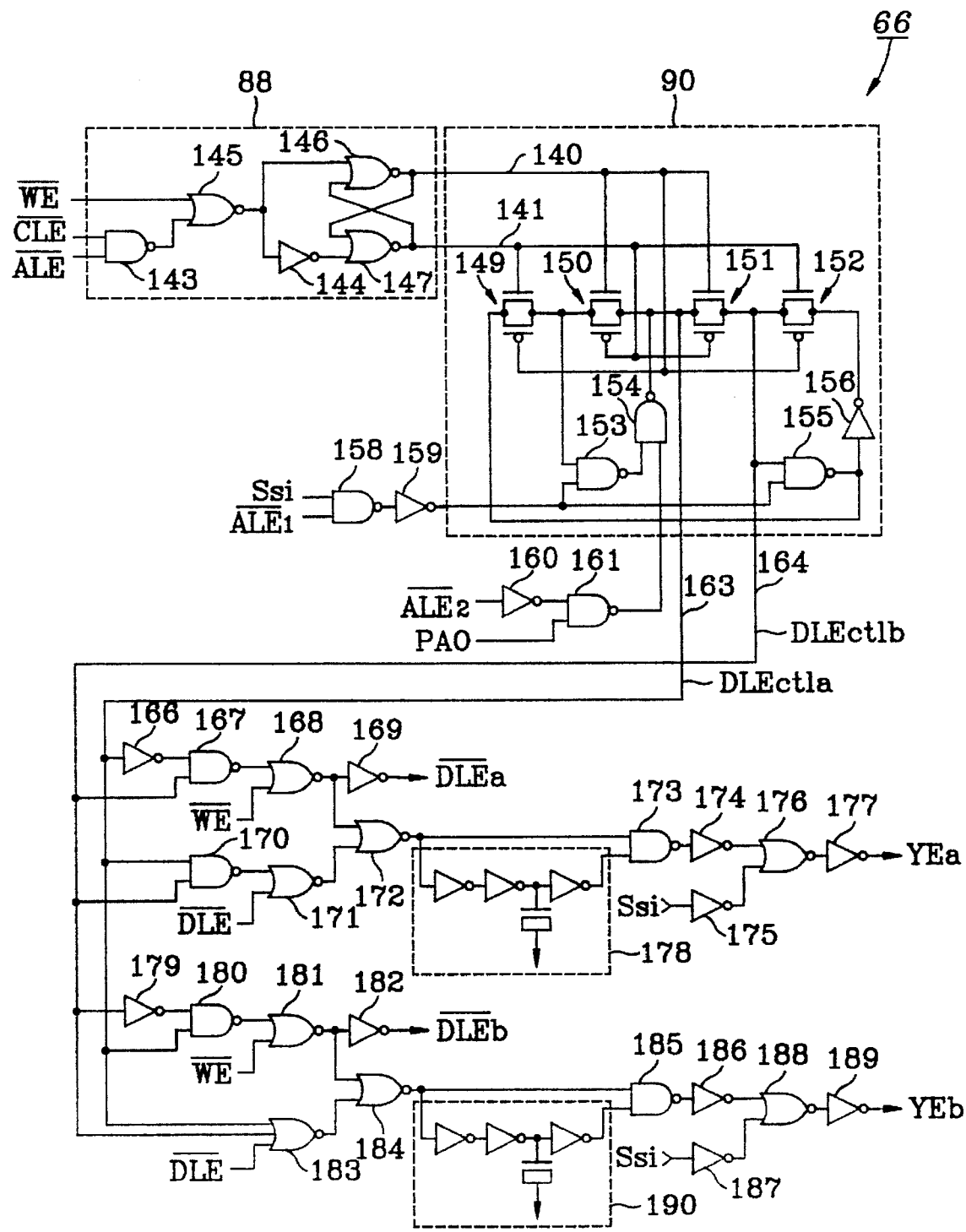
FIG. 11 is a schematic circuit diagram showing the data I/O switching circuit of FIG. 6.

Referring to FIG. 11, the data I/O switching circuit 66 includes a write clock generator 88 for generating a clock which synchronizes with the write enable signal $\overline{WE}$ during a program operation. The write clock generator 88 comprises a NAND gate 143, NOR gates 145 to 147 and an inverter 144. After reception of the external address signals, since the NAND gate 143 generates a logic "low" level signal with the signals $\overline{CLE}$ and $\overline{ALE}$ staying at logic "high"

levels during toggling of the write enable signal $\overline{WE}$, the output line 140 of write clock generator 88 provides a clock signal synchronizing with a write enable signal $\overline{WE}$, while the output line 141 thereof provides the complement signal of the clock signal on the output line 140. On the other hand, the output lines 140 and 141 respectively stay at logic "high" and "low" levels during the program command input period and external address signal input period. A counter circuit 90 in the data I/O switching circuit 66 comprises transfer gates 149 to 152, NAND gates 153 to 155 and an inverter 156. When the first address latch enable signal $\overline{ALE_1}$ goes to logic "low" level, a NAND gate 158 and inverter 159, then, cause the counter circuit 90 to be reset, thereby allowing the output lines 163 and 164 of the counter circuit 90 to go to logic "low" levels. A circuit portion composed of an inverter 160 and a NAND gate 161 loads the least significant address signal PA0 when the second address latch enable signal $\overline{ALE_2}$ goes to a logic "low" level. Hence, the counter circuit 90 outputs a reset state, i.e. a logic "low" level, to the output lines 163 and 164 when the first address latch enable signal $\overline{ALE_1}$ goes to the logic "low" level. Thereafter, when the second address latch enable signal $\overline{ALE_2}$ goes to the logic "low" level, the counter circuit 90, then, outputs the least significant address signal PA0 to the output lines 163 and 164. That is, if the signal PA0 is at a logic "low" level, counter output signals DLEct1a and DLEct1b on output lines 163 and 164 go to logic "low" levels, while if the signal PA0 is at a logic "high" level, the counter output signals DLEct1a and DLEct1b on the output lines 163 and 164 go to logic "high" levels. Where the signal PA0 is at the logic "low" level during a data input period, i.e. a data loading period followed by an external address input period, the signal DLEct1a is toggled each time the write enable signal $\overline{WE}$ goes from a logic "high" level to logic "low" level, while the signal DLEct1b is toggled each time the write enable signal $\overline{WE}$ goes from a logic "low" level to logic "high" level. On the other hand, where the signal PA0 is at the logic "low" level during the data loading period, the signal DLEct1b is toggled each time the signal $\overline{WE}$ goes from a logic "high" level to logic "low" level, while the signal DLEct1a is toggled each time the signal $\overline{WE}$ goes from a logic "low" level to logic "high" level.

A circuit portion composed of inverters 166 and 169, a NAND gate 167 and a NOR gate 168 produces the first data latch enable signal $\overline{DLEa}$ in response to the signals DLEct1a and DLEct1b. A circuit portion composed of inverters 179 and 182, a NAND gate 180 and a NOR gate 181 produces the second data latch enable signal $\overline{DLEb}$ When the write enable signal $\overline{WE}$ stays at a logic "low" level, the first data latch enable signal $\overline{DLEa}$ is a clock signal which becomes a logic "low" level each time the signal DLEct1a stays at a logic "low" level and the signal DLEct1b stays at a logic "high" level. When the write enable signal $\overline{WE}$ stays at logic "low" level, the second data latch enable signal $\overline{DLEb}$ is a clock signal which becomes a logic "low" level each time the signal DLEct1a stays at a logic "high" level and the signal DLEct1b stays at a logic "low" level. Thus, the signals $\overline{DLEa}$ and $\overline{DLEb}$ are clock signals which alternately go to the logic "low" level each time the write enable signal $\overline{WE}$ goes to the logic "low" level. If the least significant address signal PA0 stays at a logic "low" level, the second data latch enable signal $\overline{DLEb}$ goes to the logic "low" level earlier than the signal $\overline{DLEb}$, whereas if the least significant address signal PA0 stays at logic "high" level, the first data latch enable signal $\overline{DLEa}$ goes first to logic "low" level. Therefore, since the first and second data latch enable signals $\overline{DLEa}$ and $\overline{DLEb}$ are alternately generated each time the write enable signal $\overline{WE}$ goes to logic "low" level, data input every cycle of $\overline{WE}$ to each data I/O terminal I/Ok are alternately and successively latched to the first and second data input latches 84 and 85, and are alternately output to the first and second data buses 74 and 76. This allows data to be input at high speed by using the write enable signal $\overline{WE}$ with a shorter cycle.

A circuit portion composed of NAND gates 170 and 173, NOR gates 171, 172 and 176, inverters 174, 175 and 177 and a delay circuit 178 a first column decoder enable signal YEa. A circuit portion composed of NOR gates 183, 184 and 188, a NAND gate 185, inverters 186, 187 and 189 and a delay circuit 190 generator for a second column decoder enable signal YEb. The first and second column decoder enable signals YEa and YEb are clock signals which alternately stay at logic "high" levels during each cycle of $\overline{WE}$ every time the write enable signal $\overline{WE}$ goes from logic "low" level to logic "high" level during a data write period. If the least significant address signal PA0 stays at a logic "low" level, the second column decoder enable signal YEb of the signals YEa and YEb first goes to the logic "high" level, while if the least significant address signal PA0 stays at a logic "high" level, the first column decoder enable signal YEa first goes to the logic "high" level. On the other hand, since the data loading command flag Ssi remains the logic "low" level during a data loading operation, the outputs of the NOR gates 176 and 188 stay at logic "low" levels. Therefore, the first and second column decoder enable signals YEa and YEb are held at logic "high" levels, thereby causing the first and second column decoders 24 and 26 to be enabled.

Returning again to FIG. 6, the clock generator 64 serves to generate first and second clocks $\overline{CLKa}$ and $\overline{CLKb}$, which are used as counting clocks of the first and second column address counters 68 and 70, in response to control signals, such as the write enable signal $\overline{WE}$, data loading enable signal $\overline{DLE}$, read enable signal REc, data loading command flag Ssi and column address count up signal $\overline{YCNTup}$.

Figure 12A:
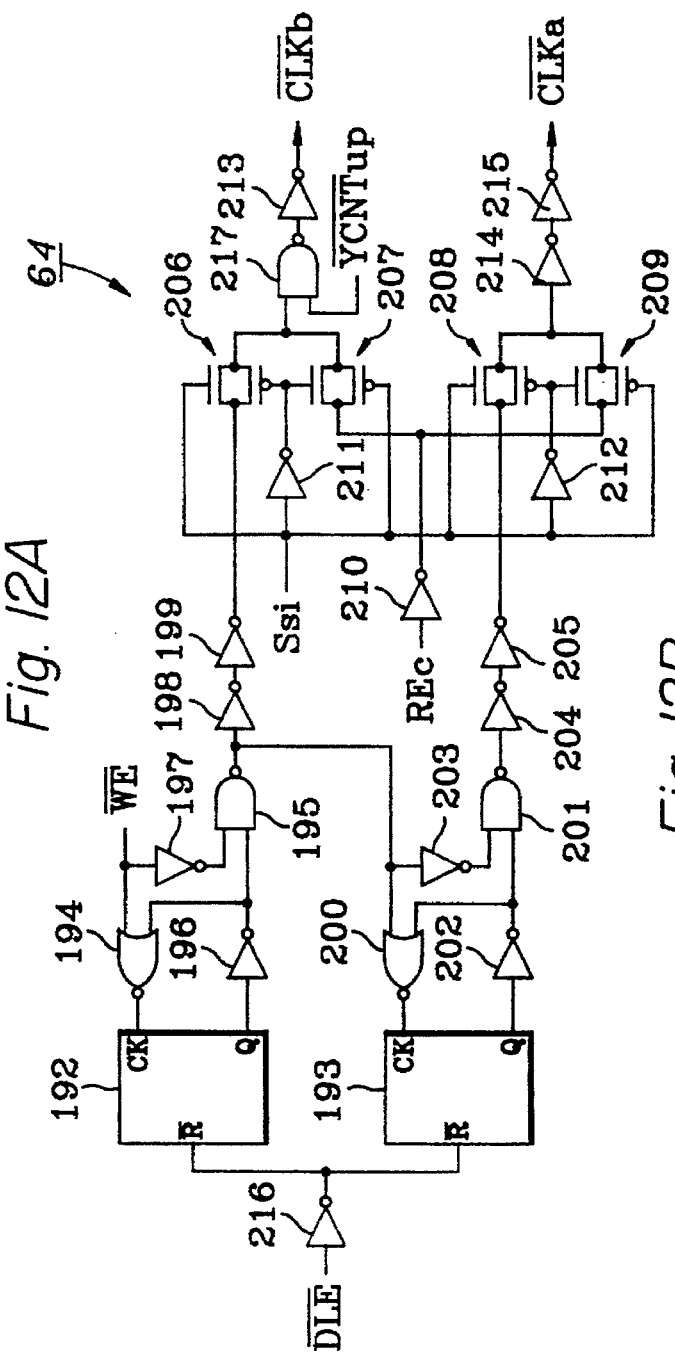
FIG. 12 is a schematic circuit diagram showing the clock generator of FIG. 6.
FIG. 12B is a schematic circuit diagram showing each of the counter circuits 192 and 193 of FIG. 12A.
Figure 12B:
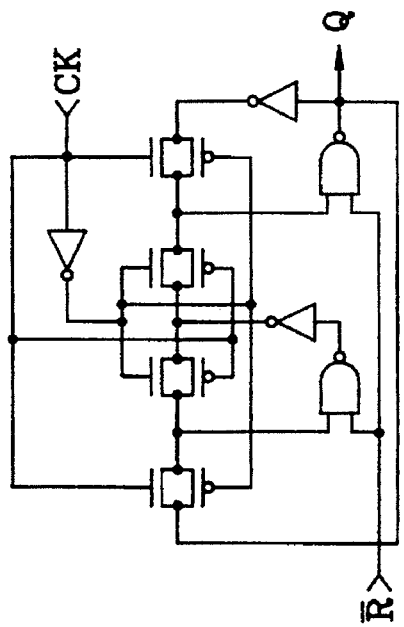

FIG. 12 is a schematic circuit diagram showing the clock generator 64 of FIG. 6. The clock generator 64 shown in FIG. 12A comprises counter circuits 192 and 193, inverters 196 to 199, 202 to 205 and 210 to 216, NOR gates 194 and 200, transfer gates 206 to 209 and NAND gates 195, 201 and 217. A circuit as shown in FIG. 12B is a schematic circuit diagram representing each of the counter circuits 192 and 193 of FIG. 12A.

The counter circuit of FIG. 12B has a reset terminal $\overline{R}$, a clock input terminal CK and an output terminal Q. If the reset terminal $\overline{R}$ stays at logic "low" level, the output terminal Q is reset to logic "high" level. When the reset terminal $\overline{R}$ stays at logic "high" level, the output terminal Q outputs the counting signal which changes its logic state in response to each of down edges of a clock pulse signal input to the clock terminal CK. Therefore, during a data input period in a program operation, the inverter 196 outputs a logic "high" level in response to the first transition of the write enable signal $\overline{WE}$ from a logic "low" level to logic "high" level. Therefore, the clock input terminal CK of counter circuit 192 is set to a logic "low" level, and the NAND gate 195 starts outputting the write enable signal $\overline{WE}$. During the data input operation, since the column address count-up signal $\overline{YCNTup}$ keeps a logic "high" level and the data loading command flag Ssi also stays at a logic "high" level, the transfer gates 206 and 208 are turned on, and the second clock $\overline{CLKb}$ becomes a clock signal which synchronizes with the write enable signal $\overline{WE}$ except the first clock pulse thereof. In a similar manner, the inverter 202 outputs a logic "high" level with the second transition of the write enable signal $\overline{WE}$ from a logic "low" level to logic "high" level, and thereby the first clock CLKa becomes a clock which synchronizes with the write enable signal $\overline{WE}$ except the first and second clock pulses thereof.

On the other hand, during a data output operation, since the signal Ssi maintains a logic "low" level, the transfer gates 206 and 208 are turned off, and the transfer gates 207 and 209 are turned on. After completion of a sensing operation of data read out from the memory cells, since the column address count-up signal $\overline{YCNTup}$ goes to a short pulse of logic "low" level as described above, the second clock $\overline{CLKb}$ goes to the short pulse of logic "low" level. Thereafter, during a data output period, each of the first and second clocks $\overline{CLKa}$ and $\overline{CLKb}$ goes to an inverted signal of the read enable signal REc.

Returning to FIG. 6, the first and second column address counters 68 and 70 receive the column address signals PA0 to PA7 from the address input buffer 58 and the most significant column address signal PA8 from the control buffer and control circuit 60, and perform a count-up operation in response to the first and second clocks $\overline{CLKa}$ and $\overline{CLKb}$, respectively. The column address counter disclosed in Korean patent application Ser. No. 94-25243 which is expressly incorporated by reference into this application, may be used for each of the first and second column address counters 68 and 70. The first and second column address counters 68 and 70 respectively generate first column address signals $A_{a0}$ to $A_{a8}$ and second column address signals $A_{b0}$ to $A_{b8}$. The least significant first column address signal $A_{a0}$ of the first column address signals $A_{a0}$ to $A_{a8}$ is a control signal for multiplexing read data on the first data bus 74 onto the third data bus 78, while the least significant second column address signal $A_{b0}$ of the second column address signals $A_{b0}$ to $A_{b8}$ is a control signal for multiplexing read data on the second data bus 76 onto the third data bus 78.

Figure 13:
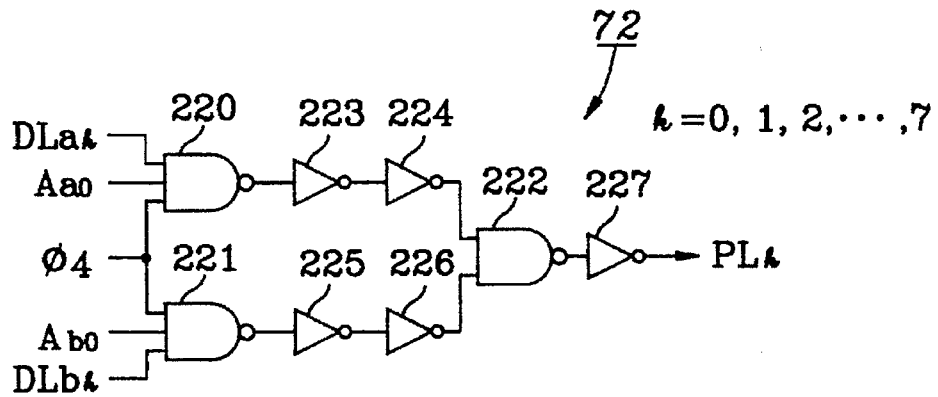
FIG. 13 is a diagram showing the data output multiplexer of FIG. 6.

FIG. 13 is a schematic circuit diagram showing the data output multiplexer 72 of FIG. 6. The data output multiplexer 72 comprises NAND gates 220 to 222 and inverters 223 to 227. The NAND gates 220 and 221 are enabled by the control signal $\phi_4$ which turns on the tri-state inverters 53 so as to output data stored in data latches 54 of FIG. 5 after completion of the sensing operation of data read out from the memory cells. Then, if the least significant first column address signal $A_{a0}$ is at a logic "high" level, the data on the third data line PLk selects the data on the first data line DLak, while if the least significant second column address signal $A_{b0}$ is at a logic "high" level, the data on the third data line PLk selects the data on the second data line DLbk.

Figure 14A:
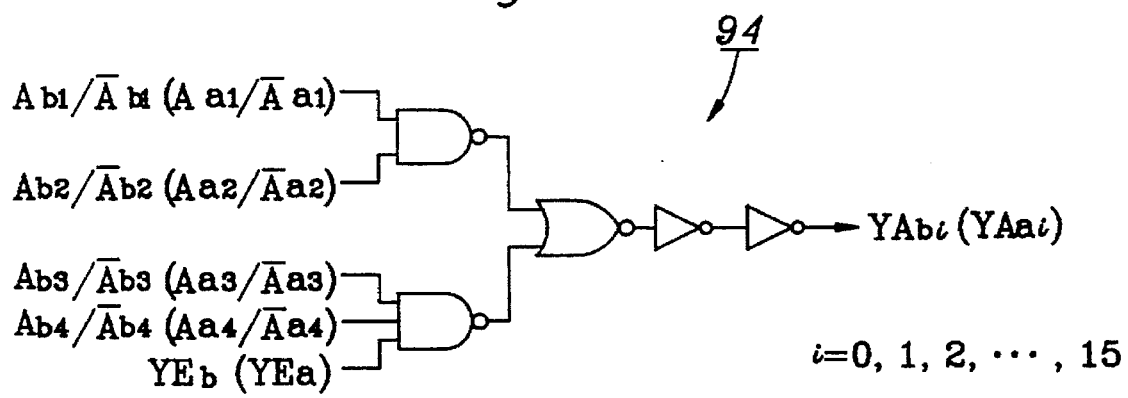
FIGS. 14A and 14B are schematic circuit diagrams respectively showing the first and second column decoders of FIG. 6.
Figure 14B:
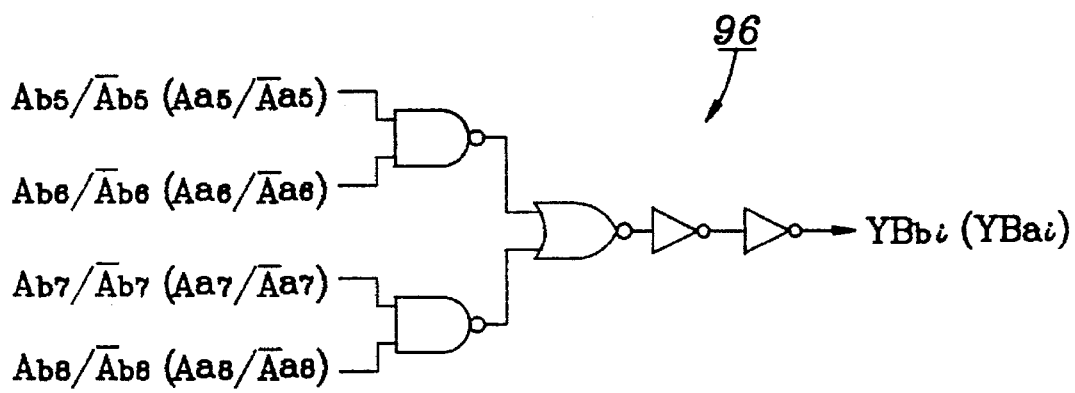

FIG. 14 is a schematic circuit diagram showing a decoder circuit constituting each of the first and second column decoders 24 and 26 of FIG. 6. FIG. 14A shows a first decoder 94 for driving the first selection circuit 38 of FIG. 4, and FIG. 14B shows a second decoder 96 for driving the second selection circuit 40 of FIG. 4. The first decoder 94 is enabled by the first or second column decoder enable signal YEa or YEb, and then generates the first or second column decoding signal YAai or YAbi decoded by the first or second column address signals $A_{a1}/\overline{A}_{a1}$ to $A_{a4}/\overline{A}_{a4}$ or $A_{b1}/\overline{A}_{b1}$ to $A_{b4}/\overline{A}_{b4}$. The second decoder 96 generates the first or second column decoding signal YBai or YBbi decoded by the first or second column address signals $A_{a5}/\overline{A}_{a5}$ to $A_{a8}/\overline{A}_{a8}$ or $A_{b5}/\overline{A}_{b5}$ to $A_{b8}/\overline{A}_{b8}$.

Operations of the preferred embodiment of the present invention will now be discussed with reference to the accompanying drawings.

Program Operation

Figure 15:
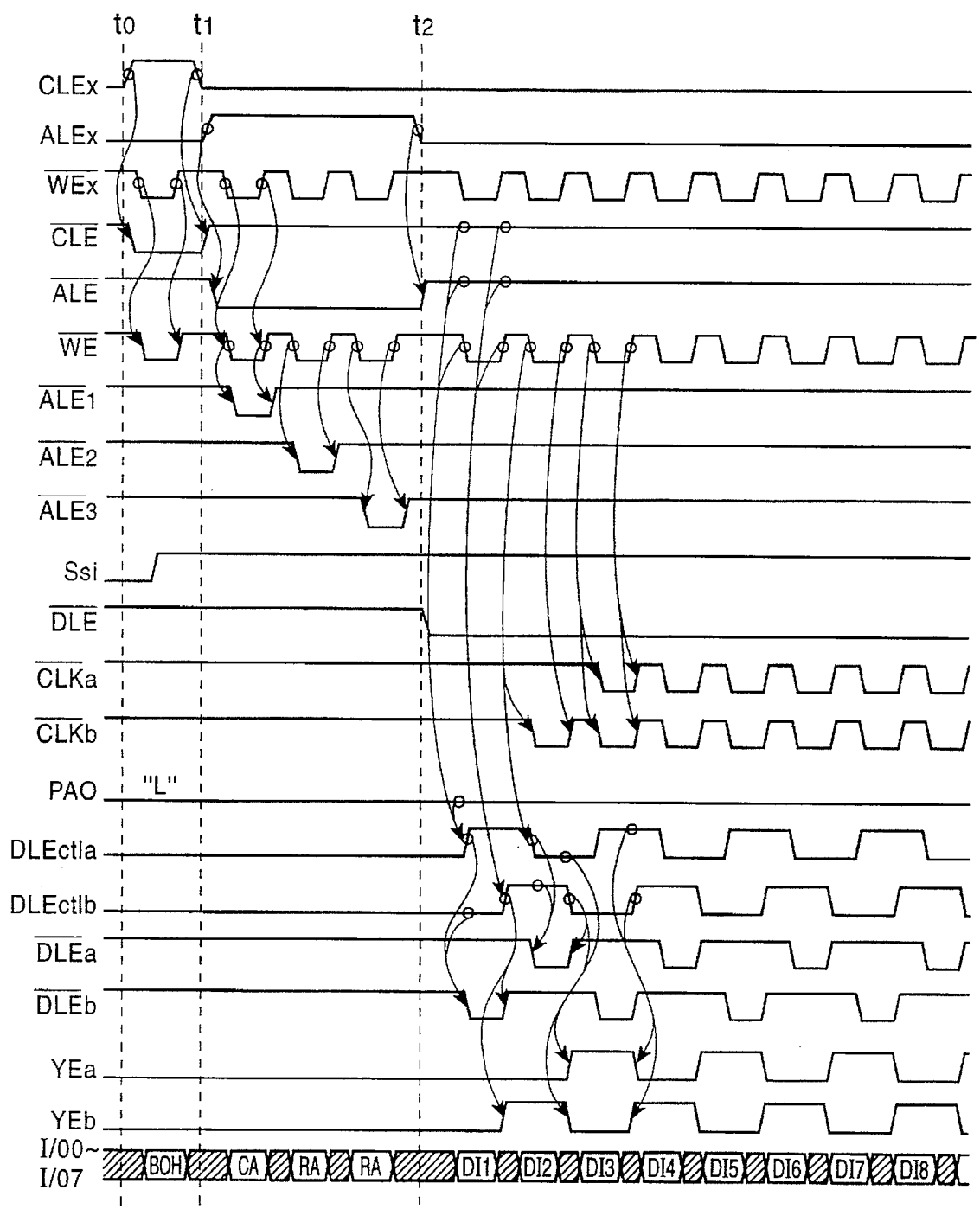
FIG. 15 is a timing chart showing a program operation where a least significant column address signal is at a logic "low" level.

FIG. 15 is a timing chart showing a program operation where the least significant column address signal PA0 stays at the logic "low" level. In the figure, the time interval between $t_0$ and $t_1$ is a program command input period. As previously discussed with reference to FIGS. 8A and 8B, prior to time $t_0$, a command designating the first half or second half of the memory area can be issued. Between the time $t_0$ and $t_1$, the program command such as 80H is input through the data I/O terminals I/O0 to I/O7 and thereby the control buffer and control circuit 60 of FIG. 6 generates a data loading command flag Ssi going to a logic "high" level. Thereafter, the address signals are input through the data I/O terminals between time $t_1$ and $t_2$.

During this time period, reception of the address signals is performed by providing 8-bit address information onto the data I/O terminals I/O0 to I/O7 at each toggle of the external write enable signal $\overline{WEx}$ when the external address latch enable signal ALEx is at a logic "high" level. That is, the column address signals $A_0$ to $A_7$ are provided onto the data I/O terminals I/O0 to I/O7 at the first toggle of the external write enable signal $\overline{WEx}$. The row address signals $A_9$ to $A_{16}$ are provided thereonto at the second toggle of $\overline{WEx}$, and the remaining row address signals $A_{17}$ to $A_{21}$ are provided thereonto at the third toggling thereof. Then, the control buffer and control circuit 60 of FIG. 6 generates the first to third address latch enable signals $\overline{ALE}_1$ to $\overline{ALE}_3$ corresponding to the three consecutive toggles of the external write enable signal $\overline{WEx}$. As shown in FIG. 10, each of the first to third address latches 80 to 82 constituting the address input buffer 58 latch the column address signals CA and the row address signals RA in response to the first to third address latch enable signals $\overline{ALE}_1$ to $\overline{ALE}_3$, respectively.

The external address input is completed at time $t_2$. Then, the control buffer and control circuit 60 generates the data loading enable signal $\overline{DLE}$ which goes to a logic "low" level, thereby initiating the data write or program operation. Thereafter, the external write enable signal $\overline{WEx}$ is toggled, thereby producing the write enable signal $\overline{WE}$ from the control buffer and control circuit 60. As described above, the clock generator 88 of FIG. 11 generates on the output line 140 the clock signal which synchronizes with the write enable signal $\overline{WE}$. The counter circuit 90 generates on the output line 163 the clock signal DLEct1a which toggles every time the write enable signal $\overline{WE}$ goes to the logic "low" level, and generates on the output line 164 the clock signal DLEct1b which toggles every time the write enable signal $\overline{WE}$ goes to a logic "high" level. As previously described with reference to FIG. 11, when the signal DLEct1a is at the logic "high" level and the signal DLEct1b is at the logic "low" level, the second data latch enable signal $\overline{DLEb}$ goes to the logic "low" level, and when the signal DLEct1a is at a logic "low" level and the signal DLEct1b is at the logic "high" level, the first data latch enable signal $\overline{DLEa}$ goes to the logic "low" level. Thus, as shown in FIG. 10, the second data input latches 85 successively latch the data DI1, DI3, DI5, DI7, . . . from the data I/O terminals I/O0 to I/O7 every time the signal $\overline{DLEb}$ goes to the logic "low" level, and then the latched data is provided in turn onto the second data lines DLbk of the second data bus 76. The first data input latches 84 successively latch the data DI2, DI4, DI6, DI8, . . . from the data I/O terminals I/O0 to I/O7 every time the signal $\overline{DLEa}$ goes to the logic "low" level, and then the latched data is provided in turn onto the first data lines DLak of the first data bus 74. Therefore, every time the signal $\overline{WEx}$ goes to the logic "low" level, the second and first data latches 85 and 84 associated with respective data I/O terminals I/O0 to I/O7, in response to the second and first data latch enable signals $\overline{DLEb}$ and $\overline{DLEa}$ being enabled in turn in synchronism with the signal $\overline{WE}$, alternately latch the input data DI1, DI2, DI3, . . . with one byte each and the data latched therein is alternately provided on the second and first data buses 76 and 74.

As previously described with reference to FIG. 11, the data I/O circuit 66 generates the second column decoder enable signal YEb which synchronizes with the signal DLEct1b, and generates the first column decoder signal. YEa, i.e. the complement signal, of YEb after the first toggle of the signal YEb. Therefore, as can be seen from the timing chart of FIG. 15, after the first toggle of the signal $\overline{DLEb}$, the second column decoder enable signal YEb is in an enable state of logic "high" level when the signal $\overline{DLEa}$ goes to the logic "low" level, and the first column decoder enable signal YEa is in an enable state of logic "high" level when the second data latch enable signal $\overline{DLEb}$ goes to the logic "low" level.

On the other hand, as discussed with reference to FIG. 12, the clock generator 64 generates the second clock $\overline{CLKb}$ which synchronizes with the remaining toggles of the write enable signal $\overline{WE}$ except the first and second toggles thereof, and the first clock $\overline{CLKa}$ which synchronizes with the remaining toggles of the write enable signal $\overline{WE}$ except the first to fourth toggles thereof. The first and second column address counters 68 and 70 of FIG. 6 latch and output the column address signals PA0 to PA7 which have been stored at the first address latches 80 of FIG. 10, in response to the signal $\overline{ALE_1}$ and the column address signal PA8 from the control buffer and control circuit 60. Thereafter, the first and second column address counters 68 and 70 respectively generate the first and second column address signals $A_{a0}$ to $A_{a8}$ and $A_{b0}$ to $A_{b8}$ which are counted up from the latched column address signal PA0 to PA8 every time each of the first and second clocks $\overline{CLKa}$ and $\overline{CLKb}$ goes to a logic "low" level. That is, since the least significant column address signal PA0 is at the logic "low" level, each of the first and second column address signals $A_{a1}$ to $A_{a8}$ and $A_{b1}$ to $A_{b8}$ from the first and second column address counters 68 and 70 are identical to the initial input column address signals up to the second toggle of each of the first and second clocks $\overline{CLKa}$ and $\overline{CLKb}$, and is sequentially increased by one at each of the third, seventh, eleventh, . . . toggles thereof.

Therefore, where the least significant column address signal PA0 is at the logic "low" level, one byte of the first data DI1, which is input through the data I/O terminals I/O0 to I/O7 at the first toggle of the external write enable signal $\overline{WEx}$, is latched in the second data input latches of the data input buffer by the first low-going signal of $\overline{DLEb}$ from the data I/O switching circuit 66, and then outputs onto the second data bus 76. With the third toggle of the signal $\overline{WEx}$, the clock generator 64 generates the second clock $\overline{CLKb}$ going to a logic "low" level, and thereby the second column address counter 70 counts up the initial column address signals PA0 to PA8 so as to produce the second column address signals $A_{b0}$ to $A_{b8}$ increased by one therefrom. At the same time, the second column decoder 26 is enabled by the second column decoder enable signal YEb, and receives the column address signals $A_{b1}$ to $A_{b8}$ except the least significant column address signal $A_{b0}$ of the signals $A_{b0}$ to $A_{b8}$ thereby being decoded by the first and second decoders 94 and 96 of FIG. 14. Consequently, the second column decoding signals YAbi and YBbi from the first and second decoders 94 and 96 turns on selected transistors of the first and second selection circuits of FIG. 4 so as to permit the data DI1 on the second data bus to be stored at the corresponding data latches 34 in the second page buffer 20. With the third toggle of the external write enable signal $\overline{WEx}$, one byte of the second data DI2 from the data I/O terminals I/O0 to I/O7 is provided onto the first data bus 74 by the first data latch enable signal $\overline{DLEa}$ as described above, and ism stored in the first page buffer by the signal YEa going to the "high" level. With the seventh toggle of the external write enable signal $\overline{WEx}$, the first column address counter 68 counts up the first clock $\overline{CLKa}$ from the clock generator 64 and then generates the first column address signals $A_{a0}$ to $A_{a8}$ increased by two from the initial column address signal. In this way, the remaining data DI3, DI4, . . . is alternately stored at corresponding latches of the second and first page buffers 20 and 18. If 512 byte data has been completely stored at the first and second page buffers 18 and 20, the 512 byte data are programmed or written to the memory cells connected to one word line selected by the row address signals PA9 to PA21 which have been latched by the second and third address latches 81 and 82 of FIG. 10. Such a page program technique is disclosed in U.S. patent application Ser. No. 08/171,300.

Figure 16:
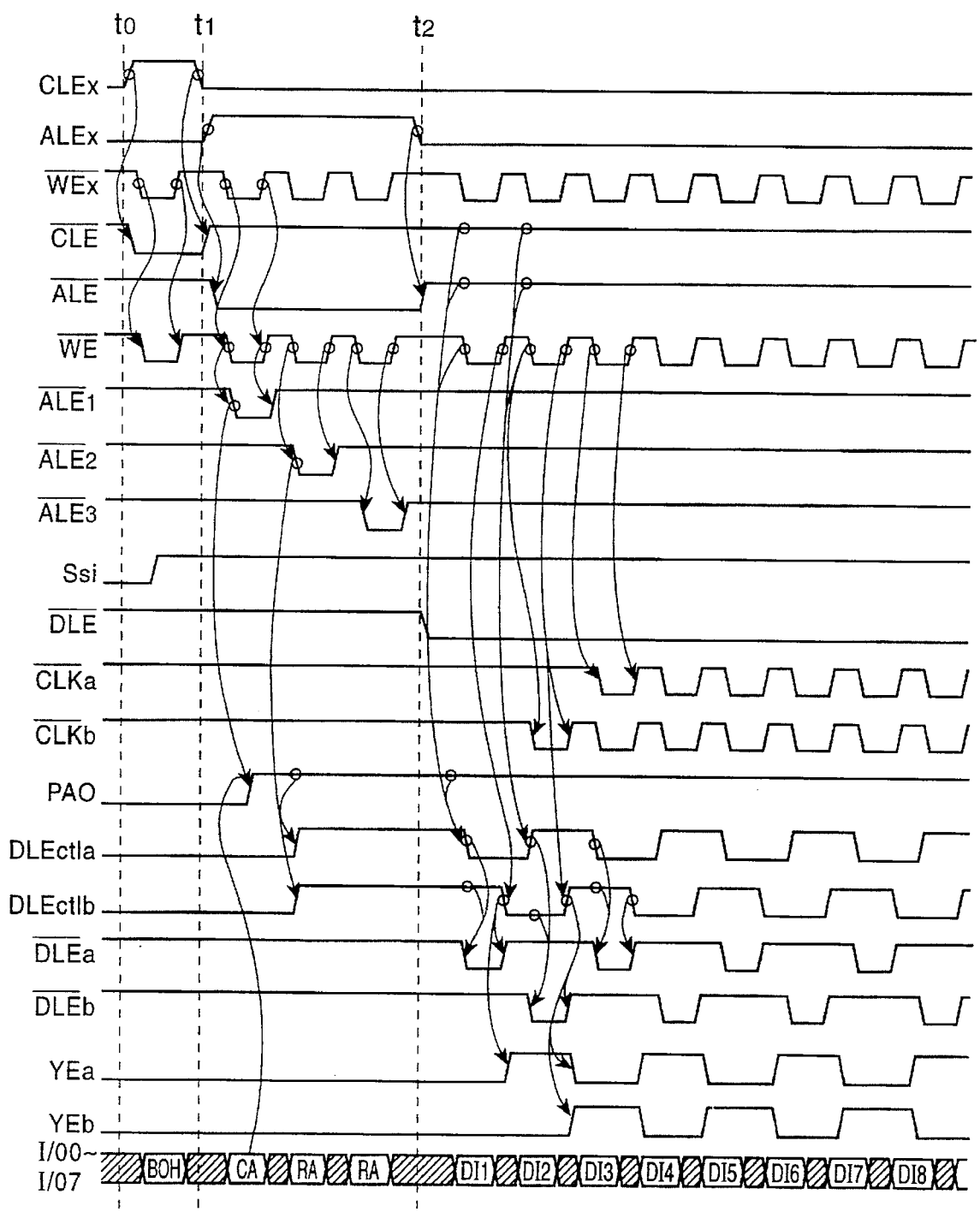
FIG. 16 is a timing chart showing the program operation where the least significant column address signal is at a logic "high" level.

FIG. 16 is a timing chart showing the program operation where the least significant column address signal PA0 is at the logic "high" level. In the figure, a program command input period between $t_0$ and $t_1$ is the same as that as previously described with reference to FIG. 15. During an external address input period between $t_1$ and $t_2$, the first address latches 80 of FIG. 10 latch external column address signals $A_0$ to $A_7$ from the data I/O terminals I/O0 to I/O7 with the first address latch enable signal $\overline{ALE_1}$ generated in response to the first toggle of the external write enable signal $\overline{WEx}$, and then produces internal column address signals PA0 to PA7. Thereafter, the counter circuit 90 of FIG. 11 generates the signals DLEct1a and DLEct1b going to logic "high" level with the signal PA0 staying at the logic "high" level and the second address latch signal $\overline{ALE_2}$ going to a logic "low" level. During the data input period after time $t_2$, as previously discussed, the data I/O switching circuit 66 of FIG. 10 generates first and second data latch enable signals $\overline{DLEa}$ and $\overline{DLEb}$ and first and second column decoder enable signals YEa and YEb in response to the respective transitions of the external write enable signal $\overline{WEx}$, as shown in FIG. 16. The clock generator 64 generates first and second clocks $\overline{CLKa}$ and $\overline{CLKb}$ in response to the toggles of the external write enable signal $\overline{WEx}$. Therefore, data DI1, DI2, DI3, . . . from the I/O terminals I/O0 to I/O7 are alternately provided to the first and second data buses 74 and 76 and alternately stored in the first and second page buffers 18 and 20, in accordance with the toggles of the external write enable signal $\overline{WEx}$. Thereafter, the data stored in the first and second page buffers are simultaneously programmed to memory cells of one selected row of the memory cell array 12, as described above.

As a result, during the data input period, i.e. the data loading period, the data sequentially provided from the data I/O terminals I/O0 to I/O7 is alternately stored at the data input buffer and then alternately loaded at the first and second page buffers according to the toggles of the external write enable signal $\overline{WEx}$, the data loading cycle time may be reduced below about 40 nsec.

Read Operation

Figure 17:
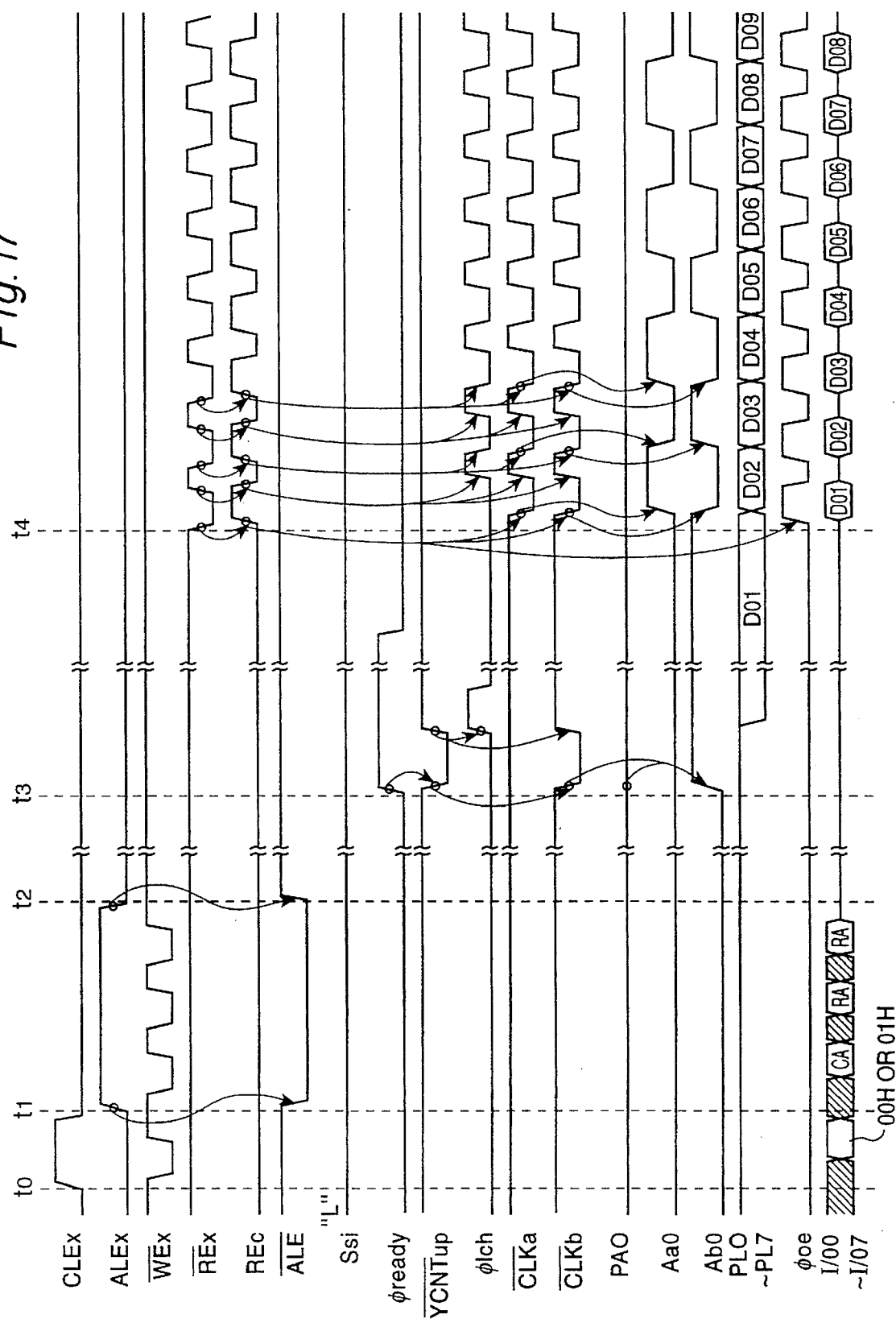
FIG. 17 is a timing chart showing a read operation where the least significant column address signal is at a logic "low" level.
Figure 18:
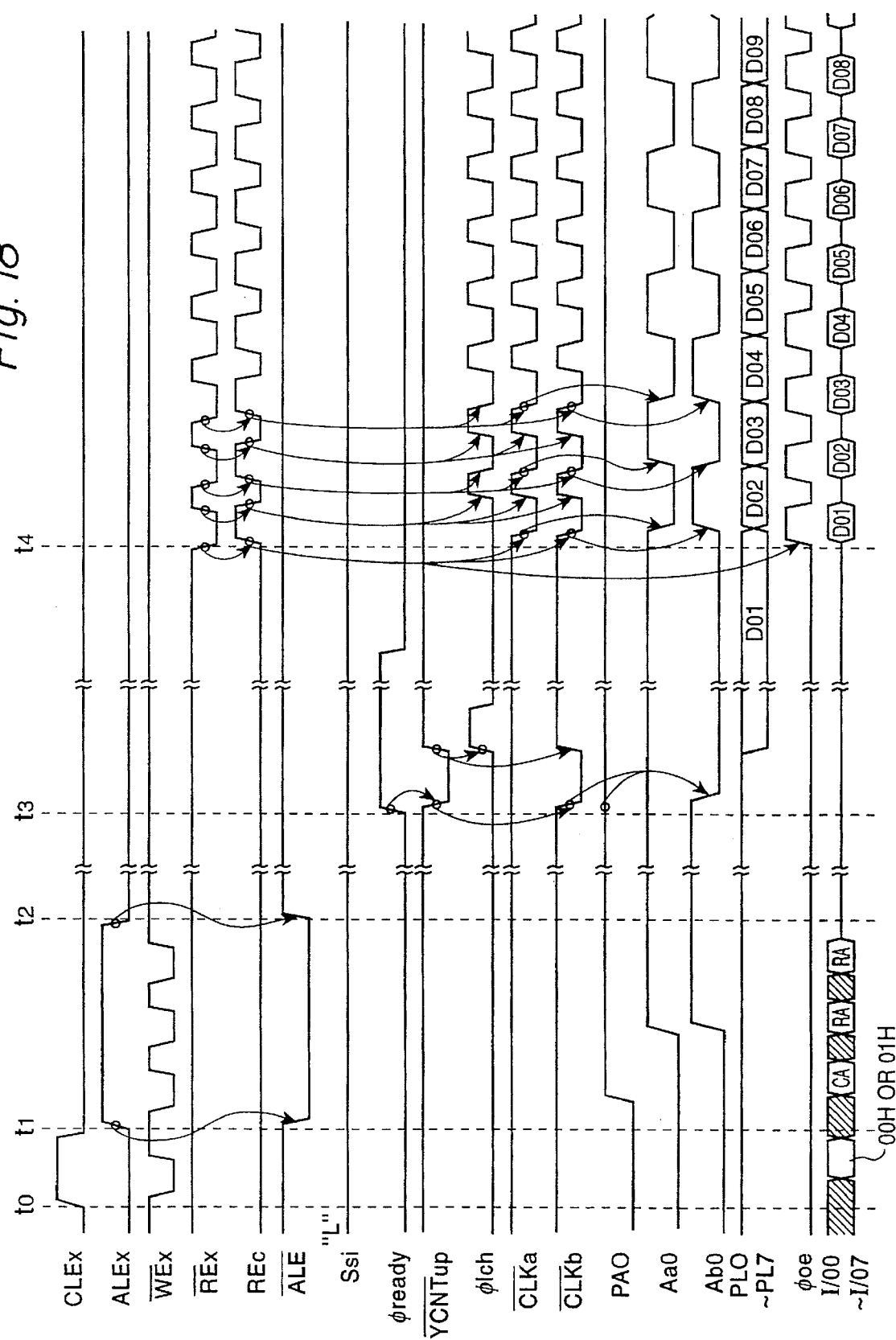
FIG. 18 is a timing chart showing the read operation where the least significant column address signal is at a logic "high" level.

FIGS. 17 and 18 are timing diagrams showing data read operations when the least significant column address signal PA0 is at logic "low" and "high" levels, respectively. In the figures, the time period between the time $t_0$ and $t_1$ is a read command input period. Inputting the read command during this period has been already described in connection with FIGS. 8C and 8D. The time period between $t_1$ and $t_2$ is an external address signal input period. During this period, the address latch operation of the external column address signals CA and external row address signals RA with the first to third address latch enable signals $\overline{ALE}_1$ and $\overline{ALE}_3$ is identical to that of FIG. 15. The time period between $t_2$ and $t_3$ is a time period required for selecting one word line with the row address signals latched at the address input buffer 58 and the read control signal from the control buffer and control circuit 60 after completion of the address latch operation and for sensing and latching the read data from memory cells connected to the selected word line. The data sensing period between the time $t_2$ and $t_3$ is about 7 μsec, and during this period, the read data are stored at the first and second page buffers. Such a page sensing technique is disclosed in the above-mentioned U.S. patent application Ser. No. 08/171,300.

The time period between $t_3$ and $t_4$ is a data output preset period for storing the read data latched at a selected one of the first and second page buffers 18 and 20 to the data output latches 142 in the data output buffer circuits 86 of FIG. 10. This period requires about 500 nsec, including the read verification period. As previously described with reference to FIG. 9, the control circuit of FIG. 9 generates the column address count-up signal $\overline{YCNTup}$ which is held at a logic "low" level for about 50 nsec in response to the data sensing completion signal $\phi_{ready}$ which goes to a logic "high" level. Thereafter, the control circuit generates the data output latch signal $\phi_{1ch}$ which remains a logic "high" level for about 40 nsec.

As described with reference to FIG. 12, the clock generator 64 generates the second clock $\overline{CLKb}$ in response to the column address count up signal $\overline{YCNTup}$, thereby causing the second column address signals $A_{b0}$ to $A_{b8}$ latched at the second column address counter 70 to be up-counted. Therefore, the least significant second column address signal $A_{b0}$ goes to a logic "high" level as shown in FIG. 17 or the least significant second column address signal $A_{b0}$ goes to the logic "low" level as shown in FIG. 18.

The data I/O switching circuit 66 of FIG. 11 produces the first and second column decoder enable signals YEa and YEb both of which are logic "high" levels in response to data loading command flag Ssi maintaining a logic "low" level during the data read operation. Thus, the first and second column decoders 24 and 26 keep in enable states during the read operation, and provide one byte of the read data onto the first and second data buses 74 and 76 which are respectively selected by the first and second column address signals $A_{a1}$ to $A_{a8}$ and $A_{b1}$ to $A_{b8}$ from the first and second column address counters 68 and 70.

The data output multiplexer 72 provides onto the third data bus 78 the read data on a selected one of the first and second data buses 74 and 76 under the control of first and second column address signals $A_{a0}$ and $A_{b0}$ having complement relationship each other. If the first column address signal $A_{a0}$ is at a logic "high" level, the data output multiplexer 72 provides the read data on the first data bus 74 onto the third data bus 78, whereas if the second column address signal $A_{b0}$ is at a logic "high" level, it provides the read data onto the second data bus 76 to the third data bus 78. Therefore, as shown in FIG. 17, since the least significant second column address signal $A_{b0}$ stays at the logic "high" level during the data preset period between the time $t_3$ and $t_4$, the read data onto the second data bus 76 is provided to the third data bus 78 and is latched at the data output latches 142 in response to the data output latch signal $\phi_{1ch}$. On the contrary, as shown in FIG. 18, since the least significant first column address signal $A_{a0}$ stays at the logic "high" level during the data preset period between the time $t_3$ and $t_4$, the read data on the first data bus 74 is provided onto the third data bus 78 and is latched at the data output latches 142 in response to the data output latch signal $\phi_{1ch}$.

The time duration after time $t_4$ is a time period for outputting the read data to the data I/O terminals I/O0 to I/O7. During this period, the external read enable signal $\overline{REx}$ toggles and thereby the control buffer and control circuit 60 produces the signal REc, i.e. the complement signal of $\overline{REx}$ and the data output enable signal $\phi_{oe}$. The control circuit of FIG. 9 generates the data output latch signal $\phi_{1ch}$ which toggles to a logic "high" level each time the signal REc toggles to a logic "low" level. On the contrary, the clock generator 64 of FIG. 12 generates the first and second clocks $\overline{CLKa}$ and $\overline{CLKb}$ in response to each of the toggles of the signal REc, and the first and second column address counters 68 and 70 each performs the count-up operation every time the respective first and second clocks $\overline{CLKa}$ and $\overline{CLKb}$ go to logic "low" levels. Then, the first and second column address counters 68 and 70 respectively generate the least significant first and second column address signals $A_{a0}$ and $A_{b0}$ which toggle each time the first and second clocks $\overline{CLKa}$ and $\overline{CLKb}$ each goes to the logic "low" level. Therefore, during the data output period, the least significant first and second column address signals $A_{a0}$ and $A_{b0}$ are generated which respectively toggles in synchronism with cycles of the clocks $\overline{CLKa}$ and $\overline{CLKb}$, i.e. those of $\overline{REx}$, having a complement relationship each other.

As can be seen from FIG. 17, the first data DO1 stored at the data output latches 142 through the third data bus 78 outputs to the data I/O terminals I/O0 to I/O7 in response to the first high level clock signal of the data output enable signal $\phi_{oe}$. Thereafter, since the least significant first column address signal $A_{a0}$ maintains the logic "high" level, the read data on the first data bus 74 is provided onto the third data bus 78 through the data output multiplexer 72, and then is latched to the data output latches 142 in response to the data output latch signal $\phi_{1ch}$ of the logic "high" level. This latched data is output to the data I/O terminals I/O0 to I/O7 in response to the second high level clock signal of the data output enable signal $\phi_{oe}$. In these manners, the read data on the first and second data buses 74 and 76 are alternately latched at the data output latches 142 every cycle of the external read enable signal $\overline{REx}$ during the data output period, and every latched data is output in turn through the data I/O terminals I/O0 to I/O7, being delayed by one cycle of $\overline{REx}$. Therefore, if the least significant column address signal PA0 is initially at a logic "low" level, the read data latched in the second page buffer and the read data latched in the first page buffer are alternately output to the data I/O terminals I/O0 to I/O7.

As can be seen from the timing chart of FIG. 18, the read data latched at the first page buffer and the read data latched at the second page buffer are alternately output to the data I/O terminals I/O0 to I/O7 in a similar manner as FIG. 17.

As described above, since the data output is performed by alternately multiplexing the data stored at the first and second page buffers to the third data bus 78 and by synchronizing with each cycle of $\overline{REx}$, it is possible to perform the data read operation at a high speed below about 40 nsec.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A nonvolatile semiconductor memory comprising:
   a plurality of floating gate type memory cells arranged in rows and columns;
   a plurality of word lines, each of said word lines being connected in common to the memory cells arranged in a given one of said rows;
   a plurality of bit lines arranged in parallel to one another, each of said bit lines being connected to the memory cells arranged in a given one of said columns, said bit lines being divided into alternatingly arranged first bit lines and second bit lines; and
   a page buffer circuit including a first page buffer portion connected to said first bit lines extending in a first column direction and a second page buffer portion connected to said second bit lines extending in a second column direction, said first column direction being opposite to said second column direction.

2. The nonvolatile semiconductor memory as set forth in claim 1, further comprising a first row decoder connected to the word lines extending in a first row direction and a second row decoder connected to the word lines extending in a second row direction, said plurality of word lines being arranged in parallel one another, each of said word lines alternately extending in one of said first and second row directions, said first row direction being opposite to said second row direction.

3. The nonvolatile semiconductor memory as set forth in claim 1, wherein each of said first and second page buffer portions comprise a data latch and sensing circuit connected to a corresponding bit line.

4. A nonvolatile semiconductor memory comprising:
   a plurality of floating gate type memory cells arranged in rows and columns;
   a plurality of word lines, each of said word lines being connected to the memory cells arranged in a given one of said rows;
   a plurality of bit lines arranged in parallel to one another, each of said bit lines being connected to the memory cells arranged in a given one of said columns, said plurality of bit lines being divided into a plurality of bit line groups, each having a pair of adjacent bit lines; and
   a page buffer circuit including a first page buffer portion connected to bit line groups extending in a first column direction and a second page buffer portion connected to bit line groups extending to a second column direction, each of said plurality of bit line groups alternately extending to either one of said first and second column directions, said first column direction being opposite to said second column direction.

* * * * *